(12) United States Patent
Op de Beeck

(10) Patent No.: US 7,800,733 B2
(45) Date of Patent: Sep. 21, 2010

(54) METHODS AND SYSTEMS FOR IMPROVED OPTICAL LITHOGRAPHIC PROCESSING

(75) Inventor: Maria Op de Beeck, Heverlee (BE)

(73) Assignee: IMEC, Leuven (BE)

( * ) Notice: Subject to any disclaimer, the term of this patent is extended or adjusted under 35 U.S.C. 154(b) by 546 days.

(21) Appl. No.: 11/486,845

(22) Filed: Jul. 14, 2006

(65) Prior Publication Data

US 2007/0013887 A1    Jan. 18, 2007

(30) Foreign Application Priority Data

Jul. 15, 2005  (EP)  ................... 05015414

(51) Int. Cl.
*G03B 27/54* (2006.01)
(52) U.S. Cl. ...................................... 355/67
(58) Field of Classification Search .................. 355/67, 355/55, 53
See application file for complete search history.

(56) References Cited

U.S. PATENT DOCUMENTS

| 5,633,713 | A | 5/1997 | Tanaka et al. |
| 6,992,750 | B2 | 1/2006 | Kawashima et al. |
| 2003/0128372 | A1* | 7/2003 | Sidorowich .................. 356/630 |
| 2004/0158808 | A1* | 8/2004 | Hansen ......................... 716/21 |

FOREIGN PATENT DOCUMENTS

| EP | 1202119 | 5/2002 |
| WO | WO 99/49504 | * 9/1999 |

OTHER PUBLICATIONS

Unno, Yasuyuki, "Polarization Analysis of Aerial Images Produced by an Optical Lithography System", Applied Optics, vol. 37, No. 10, Apr. 1, 1998, pp. 1895-1902.
European Search Report, European Patent Application No. EP05015414 dated Aug. 16, 2005.

* cited by examiner

*Primary Examiner*—Peter B Kim
*Assistant Examiner*—Chia-how Michael Liu
(74) *Attorney, Agent, or Firm*—McDonnell Boehnen Hulbert & Berghoff LLP

(57) ABSTRACT

Methods and systems are described for improving optical lithographic processing of a substrate by selecting appropriate system parameters in order to obtain a good image or print of the pattern to be obtained in a resist layer, which includes selecting a set of system parameters for an optical lithographic system having selectable system parameters, thus characterising the optical lithographic system and obtaining transferred lens pupil information. The latter is performed by obtaining, for each point of a set of points within a lens pupil of the optical lithographic system with the selected set of system parameters, a value of at least one optical parameter at a level of the substrate, the at least one optical parameter being a property of a light ray projected towards the substrate from the point of the set of points within the lens pupil. The lens pupil information then is combined with information about the mask to be used for generating the pattern in the resist layer. This combined information allows evaluating or ranking the optical lithographic system, defined by the selected set of system parameters, for the lithographic processing to be performed.

18 Claims, 18 Drawing Sheets

METHODS AND SYSTEMS FOR IMPROVED OPTICAL LITHOGRAPHIC PROCESSING

PRIORITY

The present application claims priority to the following European filed application EP 05015414.5 filed Jul. 15, 2005.

FIELD

The present invention relates to systems and methods for optimizing optical lithographic processing of a substrate. More particularly, the present invention relates to systems and methods for optimizing immersion lithographic processing or lithographic processing using a lithography tool having high numerical aperture lenses.

BACKGROUND

In the production of today's integrated circuits, optical lithography is a key processing step. The ongoing miniaturization of integrated circuits or other devices produces a number of problems, which may be encountered during optical lithography.

In an optical lithographic system, when light is incident on a mask, the light may be diffracted. The smaller the dimensions of the structures on this mask, the more the light will spread. Hence, the smaller the dimensions of the structures on the mask, less of this spread-out light will be collected by an objective lens so as to be focused onto a resist layer. As a result, the image of the mask structure formed onto the resist layer may be of a low quality. The collection of light can be improved by choosing a lens with a high numerical aperture (NA). The use of such high NA lenses results in a high angle of incidence of the focused light onto the wafer and in a reduction of the depth of focus. The problem of high angle of incidence can be overcome by introducing a medium with a higher refractive index, i.e. higher than air, in-between the lens and the resist, which is typically done in case of immersion lithography.

The quality of the printed image in optical lithography depends on the polarization state of the light used, which has an influence on the transmission, reflection and interference properties in a resist layer. As the polarization state of the light typically changes during its propagation through the optical system, it is difficult to ascertain the affect of using light initially having a given polarization state. The presence of large angles of diffraction and large angles of incidence, due respectively to the shrinking dimensions of mask structures and the use of high NA lenses in the optical system, will make light propagation even more prone to the polarization status of the transmitted and/or reflected light, resulting in a non-obvious, non-straightforward correlation between the polarization behaviour of the light source and the obtained quality of a printed image. It is to be noted that the polarization behaviour of the light source may be uniform or non-uniform, meaning that the polarization state of the light source may be identical or varying between different points in the light source.

In order to obtain a correct image or print of the mask info onto the resist layer upon the wafer and/or in order to be able to estimate the influences of polarization and diffraction on the image or print of the mask info onto the resist layer upon the wafer, it would be useful to obtain information about the amount of light and the polarization state of the light reaching a resist layer in a lithographic system. Some efforts have already been made in order to take into account the influence of the polarization state of light used in optical lithographic processing.

For example, methods are known for obtaining useful information about the light transmission and its polarization state. Typically, Maxwell equations are used to describe the optical effects in an optical system, as described in more detail in "Principles of Optics: Electromagnetic Theory of Propagation, Interference and Diffraction of Light ($7^{th}$ edition)" by Born and Wolf, Cambridge United Press 1999. The use of Maxwell equations to describe the complete optical system results in very tedious and labour-intensive methods or methods that do not yield a solution. Alternatively, in order to overcome complexity, current methods often make use of a reduced set of equations, corresponding to a simplified description of the optical system, resulting in errors and incorrect understanding, and leading to less optimal optical lithographic processing.

US patent application US-2004/0119954 A1 describes a method and apparatus for preventing deterioration of the imaging performance due to the influence of polarization. The document describes a method and apparatus such that, for light having a specific angle of incidence, the light only includes s-polarized light. The number of existing optical lithographic systems fulfilling these requirements is limited. Typically, a polarization control part is used. Nevertheless, as the polarization at the device level typically will not be uniform, even if a—theoretically—perfectly polarized source and a non-polarized mask and lens are used, a mixture of s-polarized light and p-polarized light will always be present, and therefore a p-polarized light component will need to be dealt with anyway.

None of the above cited methods or systems allows to relatively easily obtain useful information related to the quality of the processing obtainable for optical lithographic systems, without compromising too much of the existing optical lithographic systems.

SUMMARY

It is an object of the present invention to provide methods and systems for lithographic processing of a substrate. This lithographic processing of a substrate, for example, may result in efficiently obtaining a high quality image or print in a resist layer on a substrate. It is also an object of the present invention to provide methods and systems for obtaining useful information for optimizing the lithographic processing of a substrate. The above objectives are accomplished by methods and systems according to the present invention.

The invention relates to a method for setting up lithographic processing of a device, where the method includes: selecting a set of system parameters for an optical lithographic system having selectable system parameters; for each point of a set of points within a lens pupil of the optical lithographic system with the selected set of system parameters, obtaining a value of an optical parameter at the level of the device, the optical parameter being a property of a light ray projected towards the device from the point of the set of points within the lens pupil; and, combining information comprising the determined values linked to the position of the corresponding points within the lens pupil, with information attributed to a mask used for optical lithographic processing of the device in order to generate combined information. An evaluating step may also be carried out using the combined information of the combination of the selected set of system parameters and the mask.

The information that includes the determined values linked to the position of the corresponding points within the lens pupil may be information with reference to the polarization of the light source. The method may furthermore comprise selecting another set of system parameters and repeating portions of the method. Furthermore, evaluating may be carried out by ranking the combination of the selected set of system parameters and the mask. The optical parameter may comprise any of transmissivity, interference or reflection. The system may comprise a light source, an imaging module, a resist layer on a substrate and an immersion fluid and the selectable system parameters may comprise any of numerical aperture, real refractive index and/or absorption coefficient of the resist layer, transmissivity of the resist layer, real refractive index and/or absorption coefficient of the immersion fluid, transmissivity of the immersion fluid, polarization state of the light at each part of the light source, emission intensity of the light at the light source, emission wavelength or emission wavelength range of the light of the light source, shape of the light source, real refractive index and/or absorption coefficient and/or thickness of a bottom anti-reflective coating, substrate type, mask type, real refractive index and/or absorption coefficient and/or thickness of a top anti-reflective coating.

In a method according to an embodiment of the present invention, the optical parameter may be transmissivity, where light in the optical lithographic system is diffracted by the mask. Combining information may be carried out by determining locations in the lens pupil corresponding with diffraction orders being at least partly present in the lens pupil, and obtaining for predetermined points in the locations in the lens pupil the values of the transmissivity corresponding with these predetermined points in the locations in the lens pupil. The locations in the lens pupil corresponding with diffraction orders may correspond with those areas where the diffraction orders are imaged on the lens pupil. The predetermined points in the locations may be sampled (i.e., selected, substantially over the complete area of the locations in the lens pupil).

The optical parameter may include interference, where light in the optical lithographic system is diffracted by the mask. The combining information may comprise determining locations corresponding with diffraction orders of the light being at least partly present in the lens pupil and obtaining for predetermined points in the locations the values of the interference corresponding with these predetermined points in the locations. The predetermined points in the locations may be the centers of the locations. The predetermined points in the locations may be such that their relative position with respect to the location is substantially the same.

The information may comprise the determined values linked to the position of the corresponding points within the lens pupil is indicated in a 2-dimensional intensity plot. The two-dimensional intensity plot also may be referred to as an areal intensity plot. Obtaining a value the optical parameter at the level of the device may be based on calculation using Fresnel relations. The method, furthermore, may comprise, after the evaluating, using the evaluating of the combined information to provide input to a lithography simulator using full-system calculations of optical lithographic systems.

The present invention also relates to a method for obtaining lithographic processing related information for lithographic processing of a device, where the method includes selecting a set of system parameters for an optical lithographic system having selectable system parameters; for each point of a set of points within a lens pupil of the optical lithographic system with the selected set of parameters, obtaining a value of an optical parameter at the level of the device, the optical parameter being a property of a light ray projected towards the device from the point of the set of points within the lens pupil; and storing or outputting for each point of the set of points within the lens pupil, the value of the optical parameter combined with coordinates for the point in the lens pupil.

The optical parameter may comprise any of transmissivity, interference or reflection. The system may comprise a light source, an imaging module, a resist layer and an immersion fluid and the system parameters may comprise any of numerical aperture, real refractive index and/or absorption coefficient of the resist layer, transmissivity of the resist layer, real refractive index and/or absorption coefficient of the immersion fluid, transmissivity of the immersion fluid, polarization state of the light at each part of the light source, emission intensity of the light source, emission wavelength or emission wavelength range of the light source, shape of the light source, real refractive index and/or absorption coefficient and/or thickness of bottom anti-reflective coating, substrate type, mask type, real refractive index and/or absorption coefficient and/or thickness of a top anti-reflective coating. The polarization state of the light at different parts of the light source may comprise the polarization state of the light at each point of the light source. The value of the optical parameter at the level of the device may be transferred from a value with reference to a polarization state of the light at the device level to a value with reference to a polarization state of the light at the light source. Obtaining a value of the optical parameter at the level of the device may be based on calculation using Fresnel relations. The information may be stored or outputted as a 2-dimensional intensity plot. The 2-dimensional intensity plot may be referred to as an areal intensity plot.

The invention also relates to a system for setting up lithographic processing of a device, where the system includes: a means for obtaining a set of system parameters characteristic of an optical lithographic system; a means for obtaining (i.e., calculating) for each point of a set of points within a lens pupil of the optical lithographic system, a value for an optical parameter at the level of the device; and, a means for combining the obtained values linked to the corresponding points in the lens pupil with information about a mask, resulting in combined information. Preferably, means for evaluating, based on the combined information, are also provided for evaluating a combination of the set of system parameters and the mask.

The invention also relates to a system for obtaining lithographic processing related information for lithographic processing of a device, where the system includes: a means for obtaining a set of system parameters characteristic of an optical lithographic system; a means for obtaining, e.g. calculating, for each point of a set of points within a lens pupil of the optical lithographic system, a value for an optical parameter at the level of the device; and, a means for storing or outputting, for each point of the set of points within the lens pupil, the value of the optical parameter combined with coordinates for the point in the lens pupil.

The invention furthermore relates to a computer program product for executing any of the methods as described in the present invention. The invention also relates to a machine-readable data storage device storing such a computer program product. The invention further relates to the transmission of such a computer program product over a local or wide area telecommunications network.

It is an advantage of specific embodiments of the present invention that the methods and systems for optimized lithographic processing can take into account any of the transmission of the incoming light into the resist, the interference of the transmitted light in the resist or the reflection of the transmitted light at the interface between the resist and the substrate.

It is an advantage of embodiments of the present invention that the methods and systems for optimizing lithographic processing take into account that an s-polarized light component and a p-polarized light component will be present at the level of a device and that an optimization of the lithographic processing can be performed taking into account these components.

It is also an advantage of embodiments of the present invention that the methods and systems for optimizing lithographic processing take into account the polarization state of the light incident on or propagating in the resist.

It is an advantage of certain embodiments of the present invention that the methods and systems for optimizing the lithographic process allow using light having different polarization states (e.g., light comprising an s-component and a p-component, for making the image or print in the resist). It is also an advantage of certain embodiments of the present invention that the methods and systems allow selecting more appropriate lithographic systems to be used for lithographic processing without in advance excluding a number of lithographic systems. Thus, it is an advantage of embodiments of the present invention that the methods for optimizing lithographic processing are not a priori restricted by the specific type of opto-lithographic tool that is used.

It is furthermore an advantage of the embodiments of the present invention that the methods for optimizing the opto-lithographic processing are less tedious and require lower computational power.

Particular and preferred aspects of the invention are set out in the accompanying independent and dependent claims. Features from the dependent claims may be combined with features of the independent claims and with features of other dependent claims as appropriate and not merely as explicitly set out in the claims.

The teachings of the present invention permit the design of improved methods and apparatus for optical lithographic processing of a substrate. Although there has been constant improvement, change and evolution of devices in this field, the present concepts are believed to represent substantial new and novel improvements, including departures from prior practices, resulting in the provision of more efficient, stable and reliable methods of this nature.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

Exemplary embodiments are illustrated in referenced figures of the drawings. It is intended that the embodiments and figures disclosed herein be considered illustrative rather than restrictive. Same numerals are used to refer to corresponding features in the drawings, and in different figures, the same reference signs refer to the same or analogous elements.

DETAILED DESCRIPTION

Figure 1:
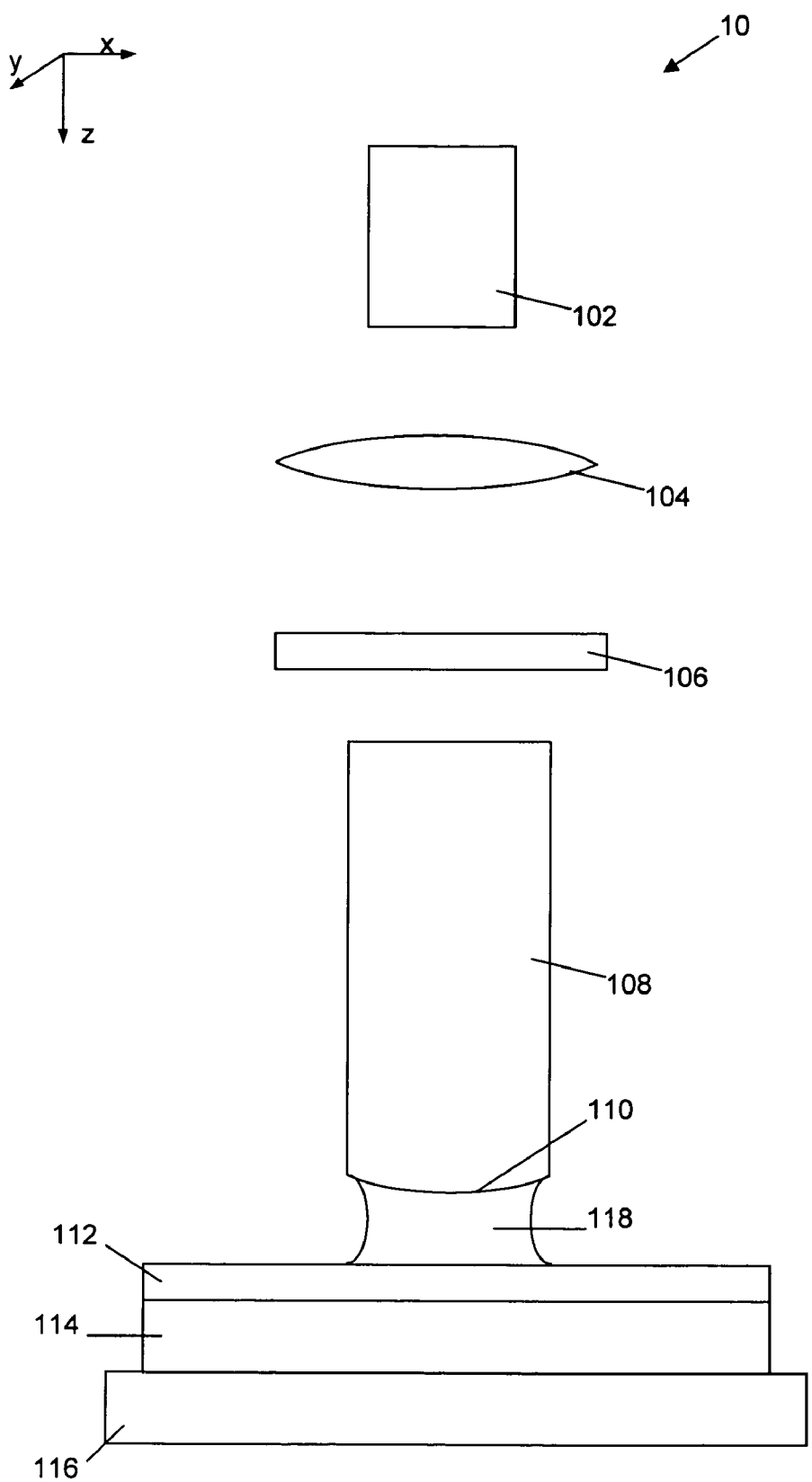
FIG. 1 is a block diagram of an exemplary optical lithographic system for optical lithographic processing.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means/steps listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a method comprising steps A and B" should not be limited to methods consisting only of steps A and B. It means that with respect to the present invention, the only relevant steps in the process are steps A and B.

The invention will now be described by a detailed description of several embodiments of the invention. It is clear that other embodiments or examples of the invention can be configured according to the knowledge of persons skilled in the art without departing from the true spirit or technical teaching of the invention, the invention being limited only by the terms of the appended claims.

In the description below, the term "substrate" may include any underlying material or materials that may be used, or upon which a device, a circuit or an epitaxial layer may be formed. In other examples, the "substrate" may include a semiconductor substrate such as doped silicon, a gallium arsenide (GaAs), a gallium arsenide phosphide (GaAsP), an indium phosphide (InP), a germanium (Ge), or a silicon germanium (SiGe) substrate, for example. The "substrate" may include, for example, a patterned layer. The term "substrate" is thus used to define generally the elements for layers that underlie a layer or portions of interest, and the layer where a pattern may be formed using lithographic processing.

In the embodiments of the present invention, use will be made of the polarization state of the incident electromagnetic radiation, e.g. light. In the present description, for determining the polarization state, reference is made to a coordinate system having one axis chosen parallel to the propagation direction of the electromagnetic radiation (i.e., light), although the invention is not limited thereby. S-direction and p-direction polarization states are defined with respect to a plane of incidence of the incident radiation beam. It is not defined if no interface is present. A reference for the substrate polarization state will be the resist surface and the angles of incidence of the radiation on the resist surface. The obtained polarization state on the substrate will not only depend on the source of electromagnetic radiation, the reticle, and the lens polarization, but may also depend on the angles of incidence of radiation rays (i.e., light rays) on the substrate. Hence, polarization depends on the pitch, lens pupil filling or coherency factor σ, radiation wavelength, diffraction order, etc. The pitch may be defined as the typical distance between two adjacent features in a repetitive pattern of a mask and may be characteristic for the periodicity of a pattern. The lens pupil-filling factor, better known as the coherence setting or coherency factor σ refers to the ratio of radiation spreading (i.e., light spreading) by a radiation source (i.e., a light source) in the lens pupil area to the lens pupil area that is proportional with the lens diameter.

The present invention will be explained hereinafter with reference to light being used as electromagnetic radiation, where, in one example, the electromagnetic radiation comprises visible light. It should be understood, however, that the electromagnetic radiation is not limited to comprising visible light. In embodiments of the present invention, methods and systems will be described for optimizing optical lithographic processing of a substrate, or substrate layers, in an optical lithographic system. Such a system may be a system adjusted for high numerical aperture (NA) lithography and/or adjusted for immersion optical lithography. With regard to the optical lithographic system, reference is not only made to a lithographic system that uses radiation in the visible wavelength range, but also to systems operating with other useful electromagnetic radiation, such as infrared radiation, ultraviolet radiation and x-ray radiation, for example. Consequently, the term "light" may also refer to electromagnetic radiation having a wavelength in the infrared, visible, ultraviolet or x-ray wavelength range.

A corresponding optical lithographic system 10 is, by way of illustration, shown in FIG. 1. The optical lithographic system 10 may be any lithographic system suitable for optical lithographic processing of a layer or substrate such as but not limited to an optical lithographic system having a transmission set-up or an optical lithographic system having a reflection set-up. In the present example, FIG. 1 illustrates an optical lithographic 100 system with a transmission set-up. The lithographic system 10 may comprise a lithographic stepper system or a lithographic scanner system, for example. The optical lithographic system 10 comprises a light source 102, which may be a selectable or adjustable light source. Typically the wavelength or wavelength range at which the light source 102 can emit as well as its emission intensity may be selectable. As different sources may emit radiation having different polarization states, the polarization state of the light source 102 is also selectable. Alternatively, an additional polarization state selector, independent from the light source 102, may be provided (not shown). It should be understood that several types of source polarization may be realized (e.g., uniformly polarized and locally polarized). Typical examples of uniformly or globally polarized sources comprise X-polarized, Y-polarized, linearly polarized or a combination of X-polarized and Y-polarized light or other polarization states corresponding with off-axis light sources, for example. Typical examples of locally polarized sources comprise azimuthally polarized light and radially polarized light. The polarization state typically is defined with reference to an absolute coordinate system xyz, as shown in FIG. 1. It is to be noted that the definition of the source polarization is difficult because it is not always clear where the source polarization is defined, as the polarization accuracy may vary and as the uniformity of the polarization may vary. In principle, the source polarization is defined as the theoretical point of the light source where the light rays are in parallel.

The light may be typically emitted through a lens 104 and incident on a mask 106.

The mask 106 may contain information about the image to be generated in a resist layer. The mask 106 may be part of a set of masks used for creating a device or circuit using lithography. The mask 106 may comprise a variety of masks (e.g., a phase shift mask, a binary mask, etc.) The light, carrying the mask information, is passed through an imaging module 108, which may have a final lens surface 110, and thus is guided to a resist layer 112 on a substrate 114. The optics of the imaging module 108 inherently define the numerical aperture (N.A.) of the imaging module 108. It is well known by a person skilled in the art that the wider the numerical aperture, the more light that can be collected (diffracted by the mask 106). The numerical aperture of the imaging module 108 may be a selectable parameter by selecting an appropriate imaging module 108.

The type of resist that the resist layer 112 comprises is amongst other parameters determined by the wavelength of the light used in the system 10. The type of resist to be used, i.e. positive or negative resist, typically correlates with the type of mask (i.e., substantially containing a negative or positive image of the pattern to be formed in the substrate). Other parameters of the resist layer 112 that may be selectable are transparency and refractive index (i.e., the real part of the refractive index of the resist layer 112 and the absorption coefficient of the resist layer 112). The substrate 114 may be mounted on a substrate stage 116. Optionally, in the case of immersion lithography, an immersion fluid 118 may be provided between the resist layer 112 and the output of the imaging module 108 (i.e., the final lens surface 110) in order to allow to increase the numerical aperture of the system 10. The type of immersion fluid 118 and its refractive index may be a selectable parameter, which can be selected by selecting a different type of immersion fluid. It is to be noted that other optical lithographic systems arrangements are possible.

In a first embodiment, the present invention relates to a method and system for constructing and providing information related to optical lithographic processing of a device, such as the substrate 114, using an optical lithographic set-up, where the information being referred to comprises "transferred lens pupil information" from the lens 104. The transferred lens pupil information is constructed by determining, for each point within the lens pupil, what the value will be of at least one specific optical parameter at the device level, for a light ray projected from each point towards the device. An optical parameter may comprise, for example, interference of light in the bulk of the resist, transmission or reflection of light at the interface between a substrate and a layer or between different layers. Such layers may comprise, for example, a resist layer, a bottom anti-reflection coating or a top anti-reflection coating or different layers or a stack thereof.

It should be noted that in all embodiments, although reference will be made of the value of the optical parameter at the device level, the device level may comprise the bulk of the resist or interfaces between different layers or between a layer and a substrate, depending on the optical parameter studied. The at least one optical parameter may be a polarization effect at the substrate level. Determination of the transmissivity, the reflectivity or the interference may be based on a classical optics description (e.g. using Fresnel relations or modified Fresnel relations), but also may be based on more complicated equations such as Maxwell equations. It is an advantage of the present invention that the methods may be based on classical optics or Fresnel optics, as this allows a mathematical less complex description. It furthermore an advantage of the methods of the present invention that the number of calculations necessary to evaluate an optical system or to compare different optical systems is limited, compared to prior art systems that need to perform a full Maxwell calculation for each system to be evaluated. Alternatively or additionally, determination of transmissivity and/or reflectivity and/or interference properties may also be carried out.

The obtained value of the one optical parameter then is combined with position related information about the corresponding point of the lens pupil of the system, from which the light ray is projected. The obtained information is referred to as "transferred lens pupil information". One representation of resulting information may be a list of groups such as optical parameter value, x coordinate lens pupil point, and y coordinate lens pupil point (i.e. each group grouping the obtained value of the optical parameter with the coordinates of the lens pupil point). Although x, y coordinates are used above by way of illustration, other types of coordinates also could be used, such as for example but not limited to cylindrical coordinates $(r, \theta)$. In another example, e the obtained value of the optical parameter may be plotted at the corresponding point on the lens pupil such as a 2-dimensional intensity plot, which may be referred to as an areal intensity plot. Such a plot could be referred to as a "transferred lens pupil map". In such a map, the coordinates may refer to the position in the lens pupil and the values may refer to the values obtained for the optical parameter. If points having the same value for the optical parameter are interconnected, contour lines may be generated and the transferred lens pupil map result in a transferred lens pupil contour map.

It is to be noted that in the following embodiments and the accompanying drawings, transferred lens pupil contour map information is used. However, this is only done for illustration purposes and the invention is not limited thereto. When more optical parameters are used (i.e., for a specific point of the lens pupil), information of more optical parameters will be available, and the representation will be extended mutatis mutandis (e.g., via groups such as optical parameter value$_1$, optical parameter value$_2$, x coordinate lens pupil point, y coordinate lens pupil point or by using more plots). The results may be stored and/or outputted, resulting in useful information for evaluating the optical lithographic processing of substrates.

Figure 2A:
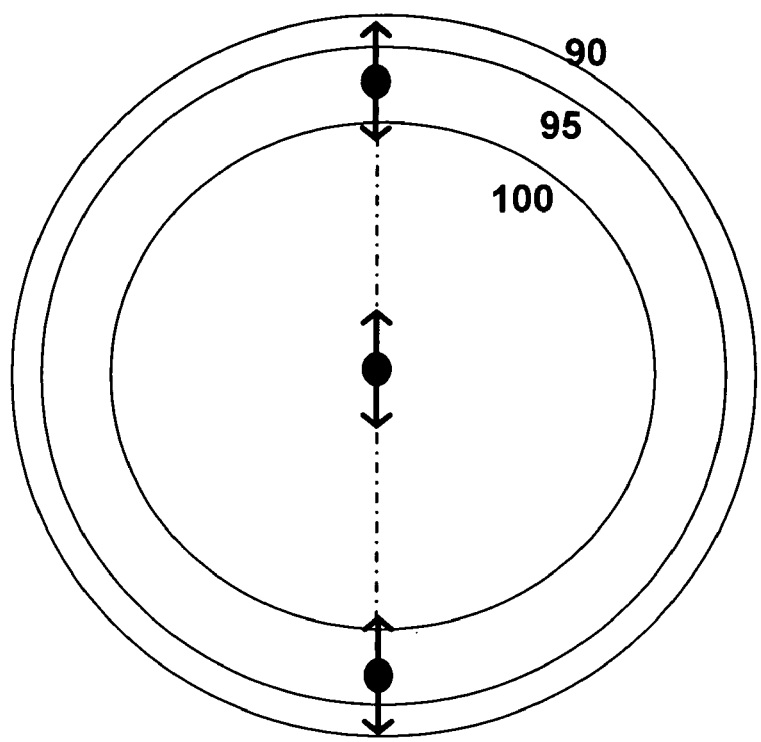
FIGS. 2A-H are contour maps illustrating device-based transferred lens pupil information for a Y-polarized light source for an X-grating (FIG. 2A, 2E) and Y-grating (FIG. 2B, 2F) and an X-polarized light source for an X-grating (FIG. 2C, 2G) and a Y-grating (FIG. 2D, 2H) relating to transmission properties (FIG. 2A, 2D) and interference inefficiency (FIG. 2E, 2H), according to an example.
Figure 2B:
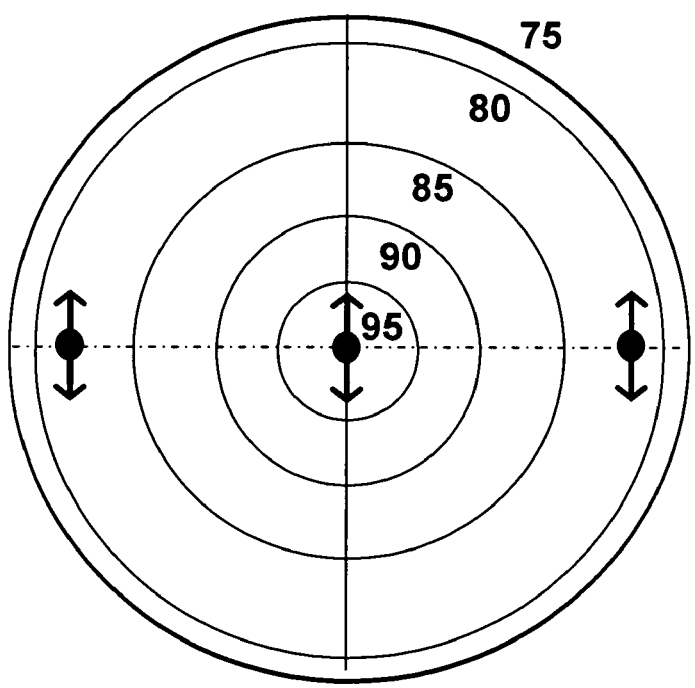
Figure 2C:
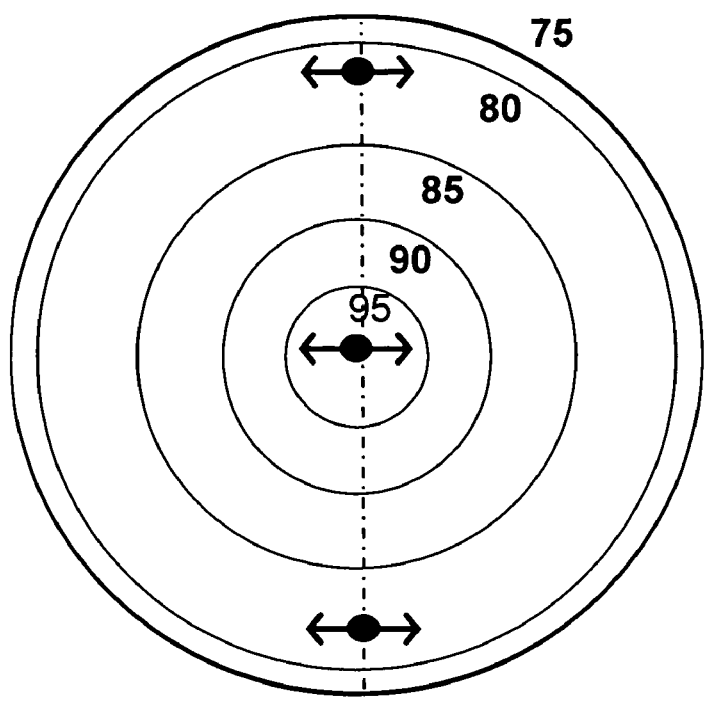
Figure 2D:
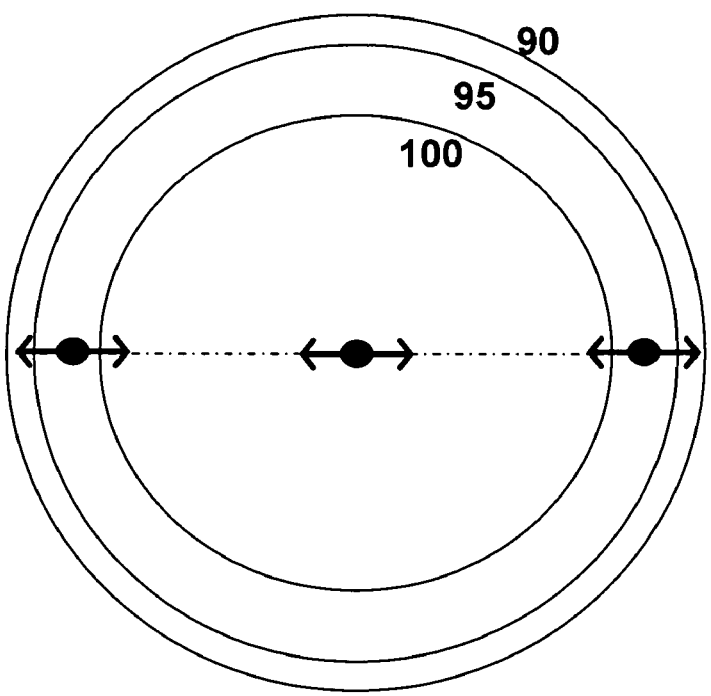
Figure 2E:
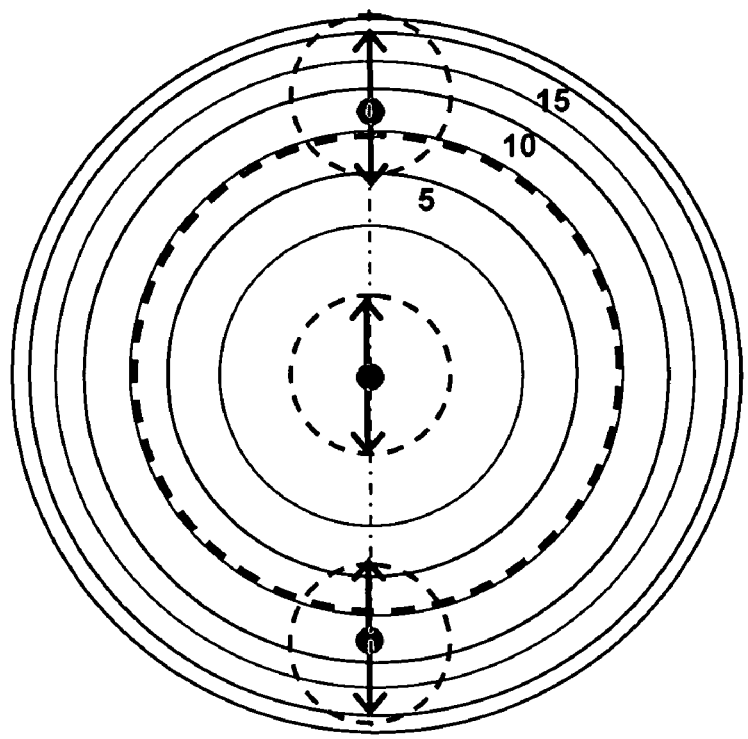
Figure 2F:
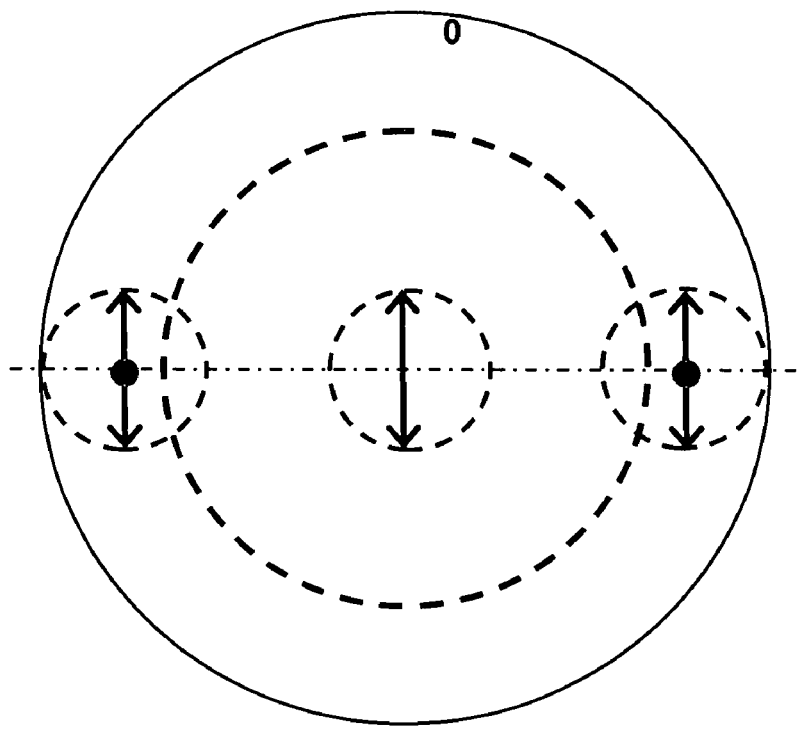
Figure 2G:
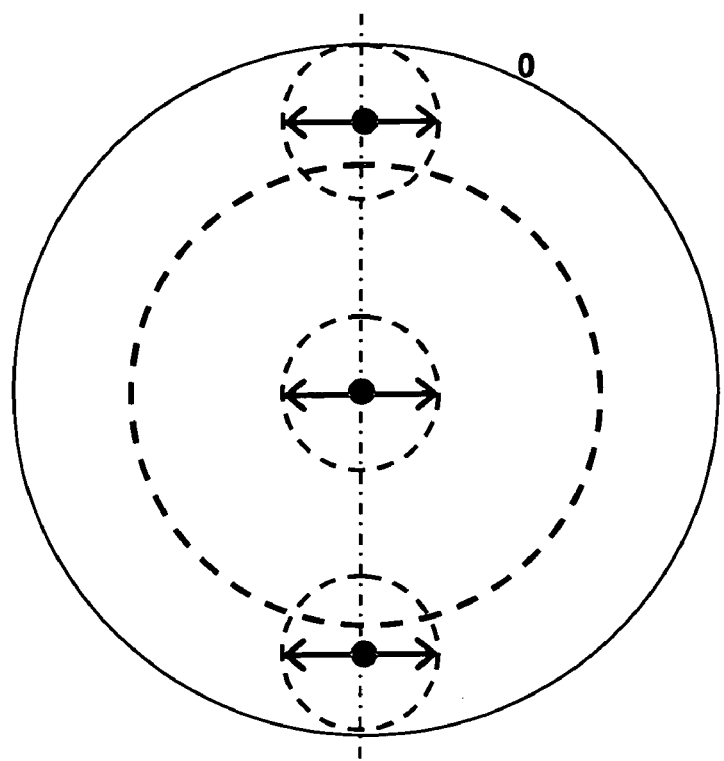
Figure 2H:
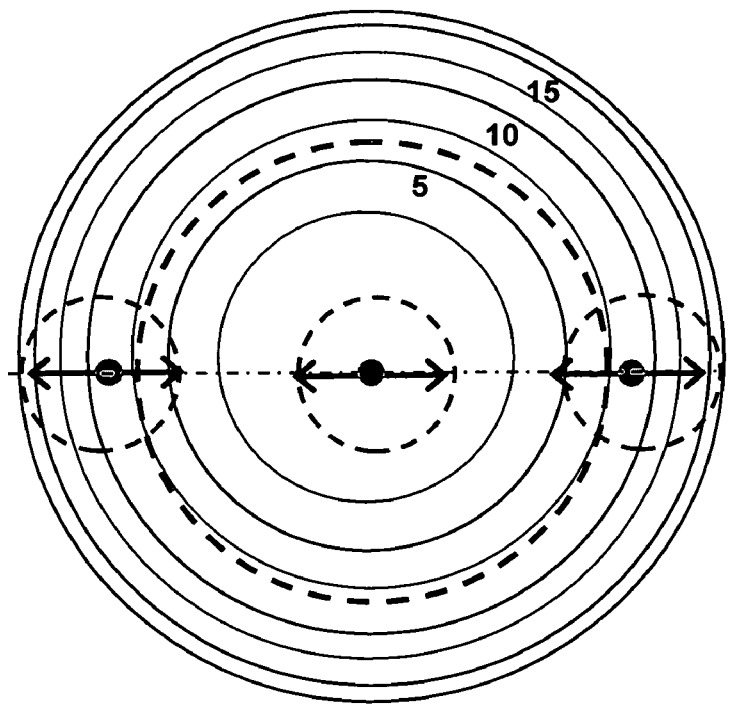

If the transferred lens pupil map is made relative towards the device level (i.e., the substrate 114), by starting from the polarization on the device level, then, due to the polar symmetry of the lens 104, circular symmetry in the obtained transferred lens pupil information will be obtained. In case of a contour map representation, this will result in contour lines being lines of the same optical property value. The latter is illustrated, by way of example in FIGS. 2A-D showing the transferred lens pupil information for s-polarized and p-polarized light, separately for X and Y gratings, with reference to the transmission of the light (i.e., the optical parameter under consideration being the transmission of the light through the system 10 relative to the original light intensity). By way of example, 2-dimensional plots are shown indicating contour lines for several specific values of the optical parameter. It should be noted that for points between a contour line having a first value A and a contour line having a second value B, the value of the corresponding optical parameter will be in a range A-B (i.e., in a range between but excluding the first and second values A, B). It should also be noted that the number of contour lines indicated is limited for clarity reasons but that the invention is not limited thereto. The plots may contain a relevant value of the optical parameter for each point in the lens pupil map. The above is valid for all lens pupil map drawings shown in the present application. FIGS. 2A-B, illustrate the transferred lens pupil map for transmission properties, such as transmission efficiency, for a system having a Y-source polarization for an X-grating respectively Y-grating, whereas FIGS. 2C-D illustrate the transferred lens pupil map for transmission properties for a system having an X-source polarization for an X-grating respectively Y-grating. For more complex polarized light sources, such as azimuthal polarized light sources, decomposition in an X-component and a Y-component can be obtained, such that a method still may be performed starting from orthogonal components. For such complex polarized light sources, the resulting X-components and Y-components also may be non-uniform over the source, which will be the case for e.g. azimuthally polarized light sources as these are locally polarized light sources. It is to be noted that decomposition in other reference components also may be used. Depending on the specific selected reference components, the decomposition may be more complicated. Similar results are shown for the transferred lens pupil information related to interference inefficiency in FIGS. 2E-H showing the transferred lens pupil information for s-polarized and p-polarized light, separately for X and Y gratings, with reference to the interference of the light. FIGS. 2E-F illustrate the transferred lens pupil map for interference inefficiency for a system having a Y-source polarization for an X-grating respectively Y-grating, whereas FIGS. 2G-H illustrate the transferred lens pupil map for transmission efficiency for a system having an X-source polarization for an X-grating respectively Y-grating.

Transferred lens pupil information related to the device level requires knowledge of the polarization state at the device level, as the transferred lens pupil information related to the device level is calculated for s-polarized and p-polarized light at the device level. As the transfer from known source polarization to device level polarization is not straightforward, it would be more useful to have the transferred lens pupil information related to the source level, as this would allow the avoidance of calculation at the device level polarization.

Figure 3A:
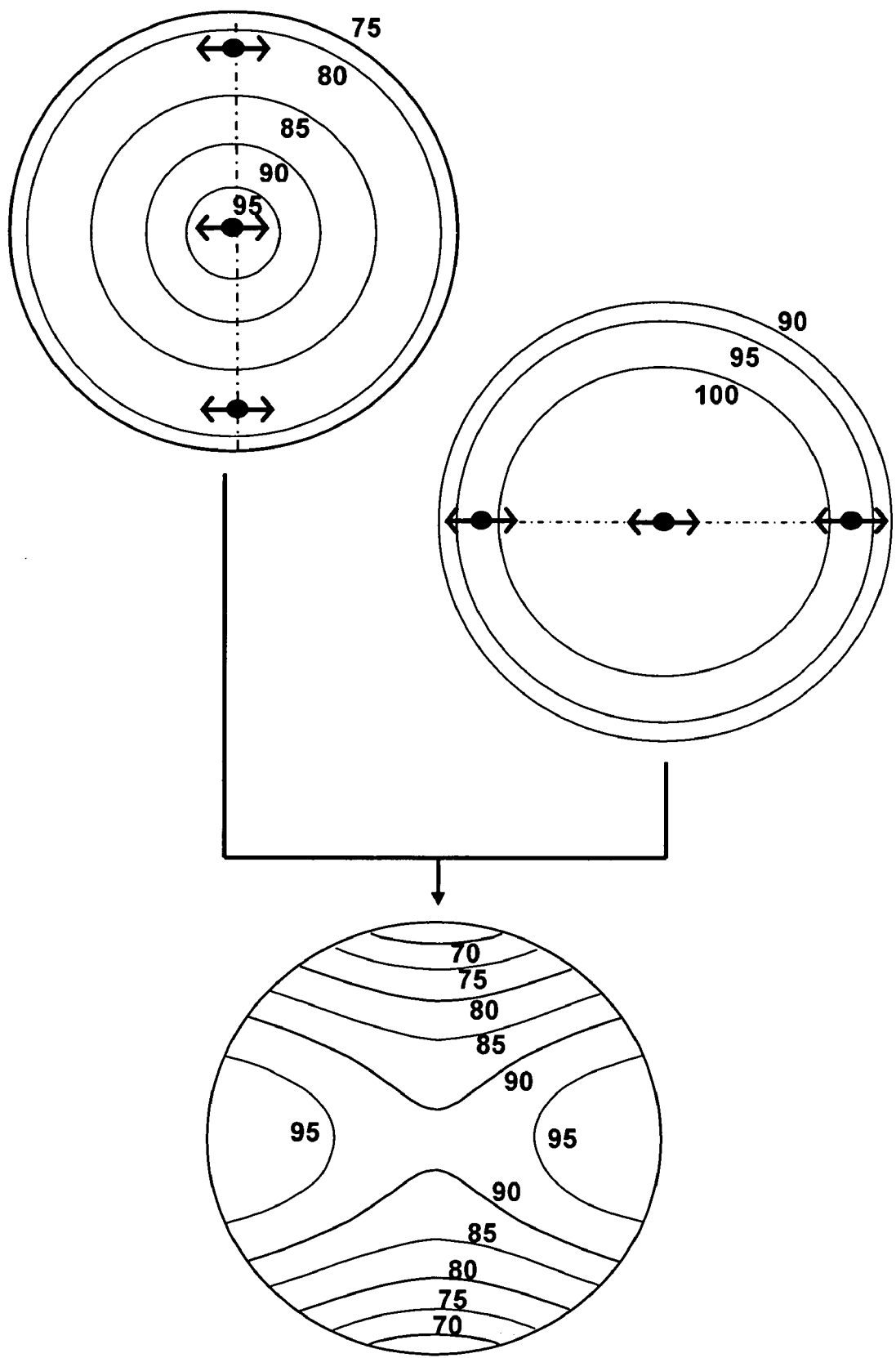
FIGS. 3A-D are contour maps showing the correlation between a transferred lens pupil information map referred to the source and a transferred lens pupil information map referred to the substrate for an Y-polarized light source (FIG. 3A, 3C) and an X-polarized light source (FIG. 3B, 3D) for the transmission properties (FIG. 3A, 3B), and the interference inefficiency (FIG. 3C, D), according to an example.
Figure 3B:
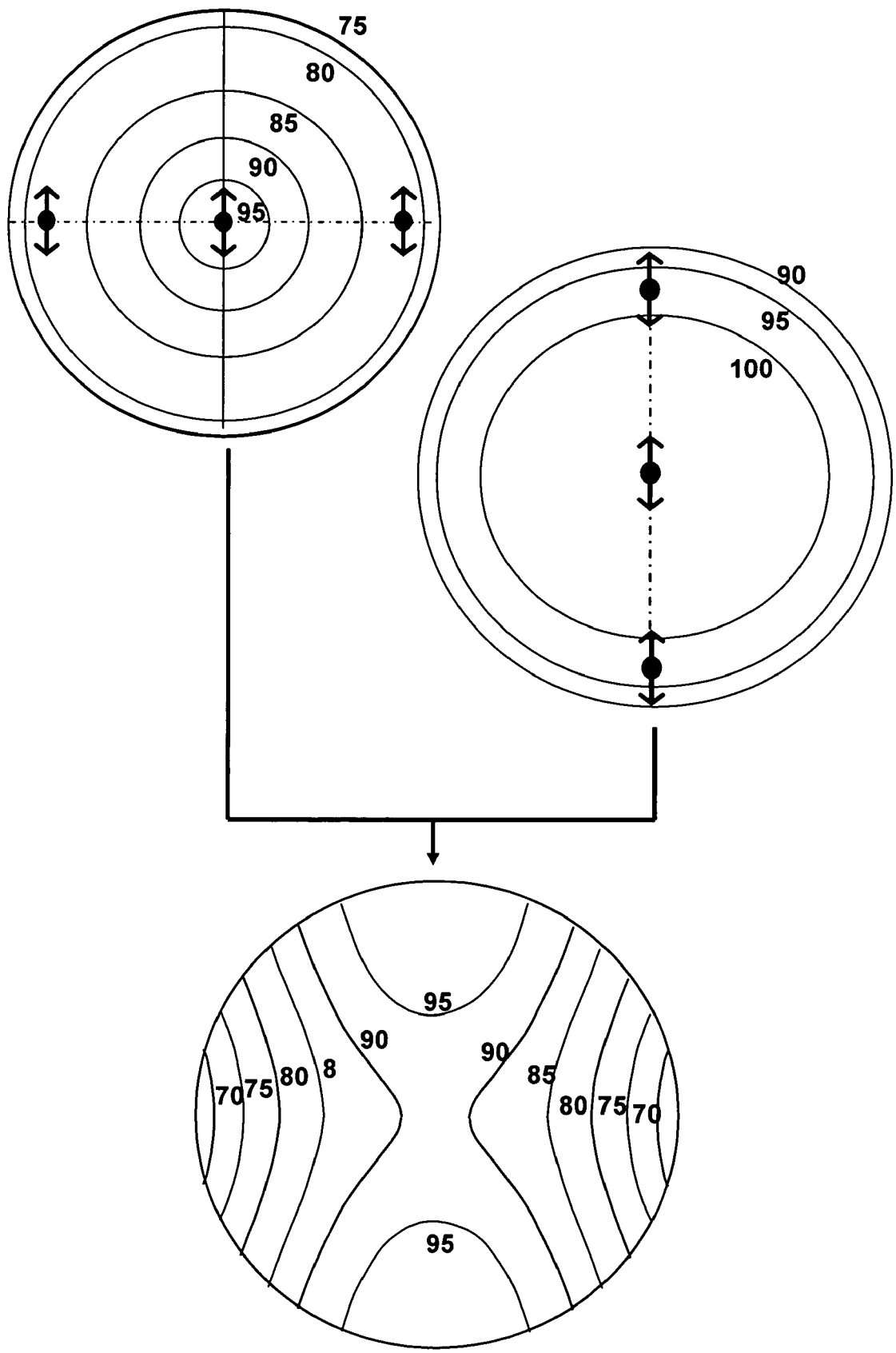
Figure 3C:
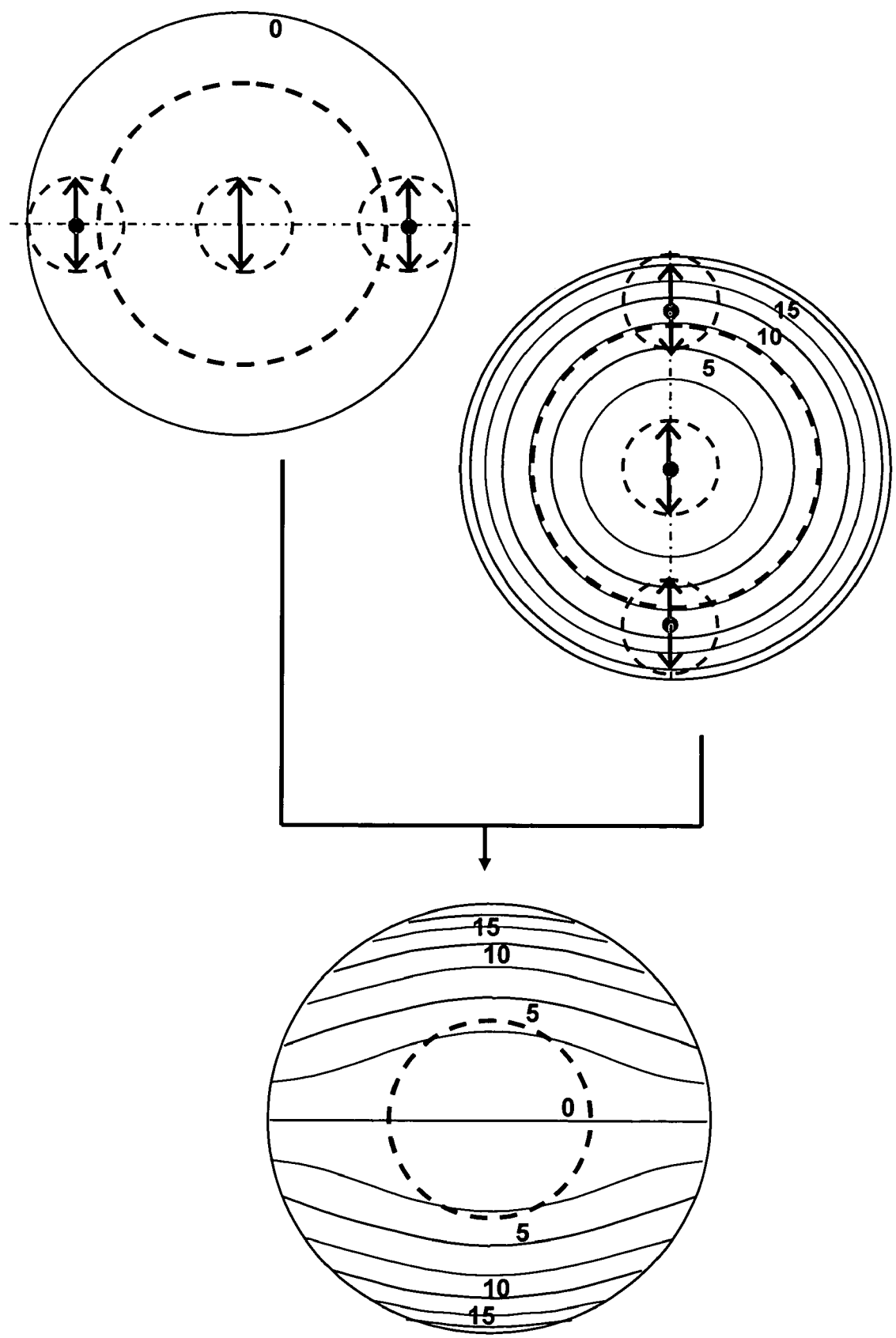
Figure 3D:
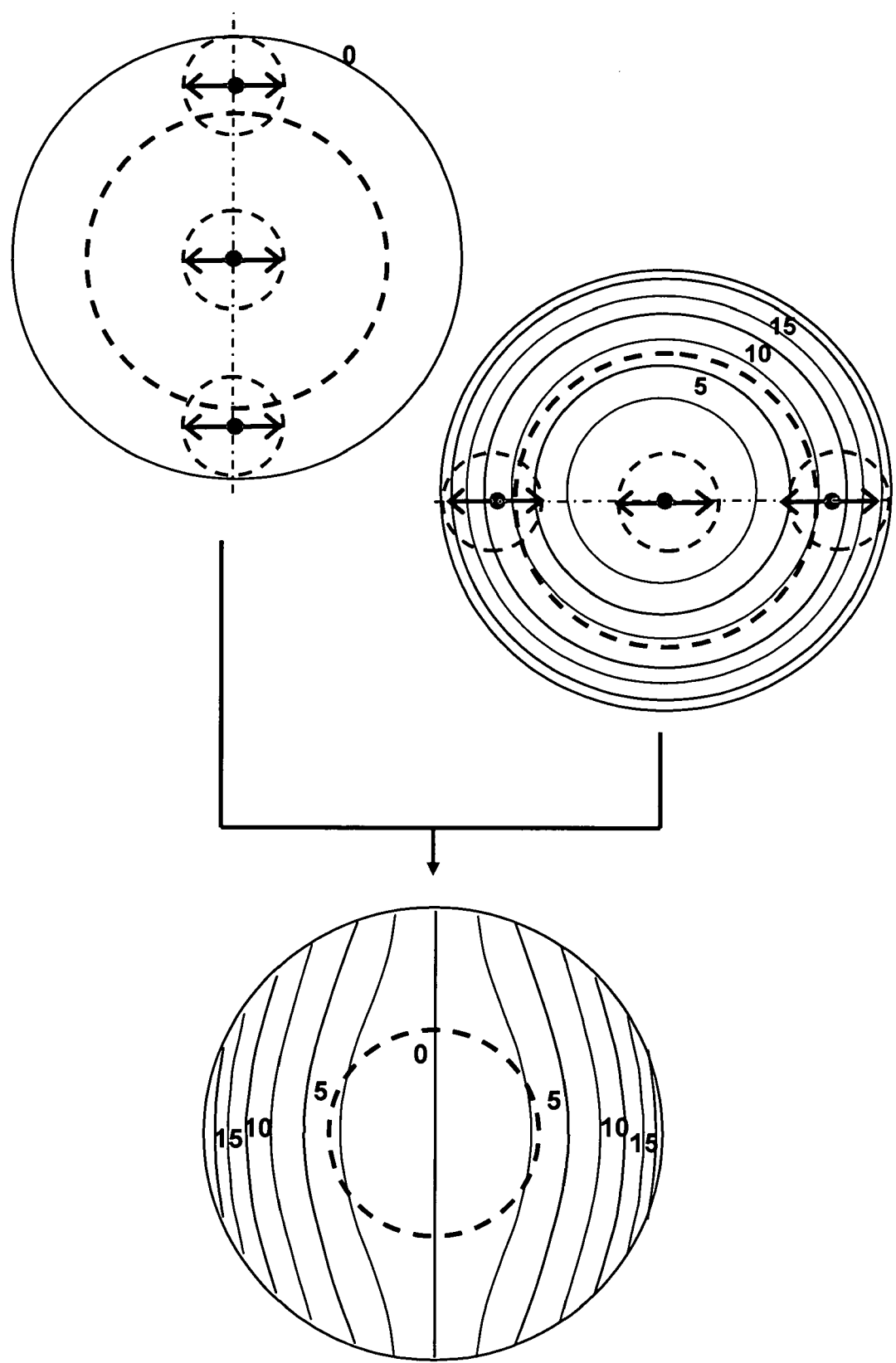

If the transferred lens pupil information is made starting from the light source 102 (i.e., starting from the polarization of the light source 102), then the obtained transferred lens pupil information may not show circular symmetry. The latter is illustrated by way of example in FIGS. 3A-B, which show the correlation between the transferred lens pupil information map for transmission efficiency related to the light source 102 and the transferred lens pupil information map for transmission efficiency related to the device level for a Y-polarization source, respectively X-polarization source. Starting from the "device level referred lens pupil maps" the "light source referred lens pupil map" may be constructed as a linear combination of the s- and p-waves for all corresponding points. Preferably linearly polarized light is used for the light source 102, and the reference is placed on the light source 102 as starting point. The correlation between "device level"-referred and "light source"-referred transferred lens pupil information may be illustrated as follows. For each "device level"-referred transferred lens pupil information and grating orientation, the source polarization is known. If for a Y-grating, only s-polarized light is obtained at the device level, it can only be generated by a Y-polarized source. Similarly, s-polarized light at the device level for an X-oriented grating can only stem from an X-polarized source. Similar results can be obtained for a p-polarization at the device level. Hence, the "device level"-related transferred lens pupil information may be regrouped, based on their corresponding source polarization. The regrouped "device level"-related transferred lens pupil information then is mathematically combined, since each mask grating orientation corresponds with a unique direction of the diffraction plane. This mathematical combination is a linear combination of the regrouped "device level"-related transferred lens pupil information, taken into account the angular dependency of the efficiency, resulting in $$T_{\text{eff},X\text{-polarised source}} = T_s \sin^2 \phi + T_p \cos^2 \phi$$

for an X-polarized light source, and $$T_{\text{eff},Y\text{-polarised source}} = T_s \cos^2 \phi + T_p \sin^2 \phi$$

for a Y-polarized light source. $\phi$ thereby is the angular coordinate of the polar coordinates describing the position of a light ray in the lens pupil and $T_s$ and $T_p$ thereby are the transmission efficiencies for s-polarized, respectively p-polarized light at the device level. In this way, for both X-polarized and Y-polarized light sources, "light source"-related transferred lens pupil information is obtained. In similar way, FIGS. 3C-D illustrate the correlation between the transferred lens pupil information map related to interference inefficiency for an Y-polarization source and an X-polarization source respectively, with respect to the transferred lens pupil information map for the device level. Mathematical combination can be performed in similar way, whereby for s-polarized light, the interference efficiency is 100% for all angles of incidence and for each grating orientation, whereas for p-polarized light the efficiency depends on the angle of incidence of the first diffraction orders, resulting in a worse interference efficiency for larger angles of incidence.

The usefulness of the transferred lens pupil maps stems from the correlation between the position of a light ray in a lens pupil and the angle and plane of incidence on the substrate 114. The correlation between the lens pupil point and the angle of incidence on the substrate 114 and its plane of incidence on the substrate 114 is shown for two different points of the lens pupil in FIG. 4. Thus, if the polarization status of the light impinging on or arriving at the lens pupil and the position of each light ray in the lens pupil are known, then the polarization status, and consequently the corresponding polarization effects, of each light ray arriving at the substrate 114 can be determined. It is to be noted that even with perfectly polarized sources such as sources emitting radiation of a single polarization state (which actually is non-realistic and refers to the rather theoretical situation of a completely uniform and completely pure polarization) and/or with non-polarizing masks and lenses (which also is non-realistic), the polarization at the device level will be a mixture of s-type and p-type polarization states with reference to the plane of the device, depending on the lens pupil filling factor or coherency $\sigma$, the pitch of the grating, the line orientation and the mask type. Polarization effects will result in visible effects on the transmission properties, the interference efficiency in the resist layer 112 and the reflectance properties of the light at the resist layer 112/substrate 114 interface.

It is to be noted that in the above method for obtaining transferred lens pupil information nearly all influences on the polarization state of light due to the mask 106 are neglected. The mask 106 typically can induce a change of the polarization state of the incoming light due to birefringence by the mask 106, the amount of birefringence depending on the type and quality of the mask 106 that is used, due to pattern or grating dependent polarization changes, such as polarization changes dependent on the mask pitch and the duty cycle and due to topography dependent polarization changes (e.g., the topography of absorber patterns, the type and/or thickness of absorber material used in the mask and/or phase shift mask features). Besides mask type information used in case of construction of transferred lens pupil information for interference efficiency, typically no further mask information is used for obtaining or constructing the transferred lens pupil information. The latter allows the acquisition of information that may be used in as many applications as possible. It is to be noted that basically the same transferred lens pupil information may be used for optical systems where only the lens pupil filling or coherency and/or the pitch is changed, which limits the amount of transferred lens pupil information sets that need to be determined for different selections of selectable parameters of an optical system.

It also is to be noticed that in the above description of the method for constructing or obtaining transferred lens pupil information, nearly all influences on the polarization state of light due to the lens 104 or the imaging module 108 are neglected. Such influences may for example be polarization dependent reflection effects which may occur at various interfaces, polarization dependent absorption effects and birefringence, which may occur at several lens elements. These effects may be pupil mesh point dependent. It should be noted that, if a theoretical or practical description of these mesh point dependent polarization effects is obtained, that the latter can be easily incorporated in the method for obtaining transferred lens pupil information, the latter falling within the scope of the invention.

In other words, polarization effects related to scalar transmission, retardance, scalar phase and de-attenuation are, for the example given, are not taken into account, but, if the effects can be described theoretically or practically, these effects can be incorporated in the methods according to the present invention.

By way of example, some more details and examples will be provided on obtaining transferred lens pupil information related to the transmission efficiency at the resist layer 112 surface and reflection properties at the substrate 114/resist layer 112 interface and transferred lens pupil information related to the interference efficiency in the resist layer 112.

Transferred lens pupil information related to transmission efficiency can, by way of example, may be based on/determined by (but not limited to) the following Fresnel relations, $$I_{r,s} = R_s I_{i,s} \quad \text{with } R_s = \left(\frac{n_i\cos\theta_i - n_t\cos\theta_t}{n_i\cos\theta_i + n_t\cos\theta_t}\right)^2$$

$$I_{r,p} = R_p I_{i,p} \quad \text{with } R_p = \left(\frac{n_i\cos\theta_t - n_t\cos\theta_i}{n_i\cos\theta_t + n_t\cos\theta_i}\right)^2$$

$$I_{t,s} = \frac{\cos\theta_t}{\cos\theta_i} T_s I_{i,s} \quad \text{with } T_s = \left(\frac{n_t\cos\theta_t}{n_i\cos\theta_i}\right)\left(\frac{2n_i\cos\theta_i}{n_i\cos\theta_i + n_t\cos\theta_t}\right)^2$$

$$I_{t,p} = \frac{\cos\theta_t}{\cos\theta_i} T_p I_{i,p} \quad \text{with } T_p = \left(\frac{n_t\cos\theta_t}{n_i\cos\theta_i}\right)\left(\frac{2n_i\cos\theta_i}{n_i\cos\theta_t + n_t\cos\theta_i}\right)^2$$

with $I_{r,s}$ being the reflected intensity for s-polarized beams, $I_{r,p}$ being the reflected intensity for p-polarized beams, $I_{t,s}$ being the transmitted intensity for s-polarized beams, $I_{t,p}$ being the transmitted intensity for p-polarized beams, $n_i$ being the refractive index of the initial medium of propagation, $n_t$ being the refractive index of the medium whereon the light is incident, $\theta_i$ is the angle of incidence being the angle between the incident beam and the normal on the plane the beam is incident to and $\theta_t$ is the angle between the normal and the transmitted beam. The transmission and reflection of the light is then determined by calculating the transmission and reflection at the different components of the optical lithographic system. Differences in transmission and reflection can, for example, be obtained by different numerical aperture (higher numerical aperture reduces transmission problems), by different refractive indices for the resist (higher refractive index of resist results in larger transmission problems), by different refractive index of the immersion fluid (higher refractive index of immersion fluid reduces transmission problems), etc. Examples of transmission efficiency depending on the source polarization are shown in FIGS. 2A-D.

Figures 4, 5A:
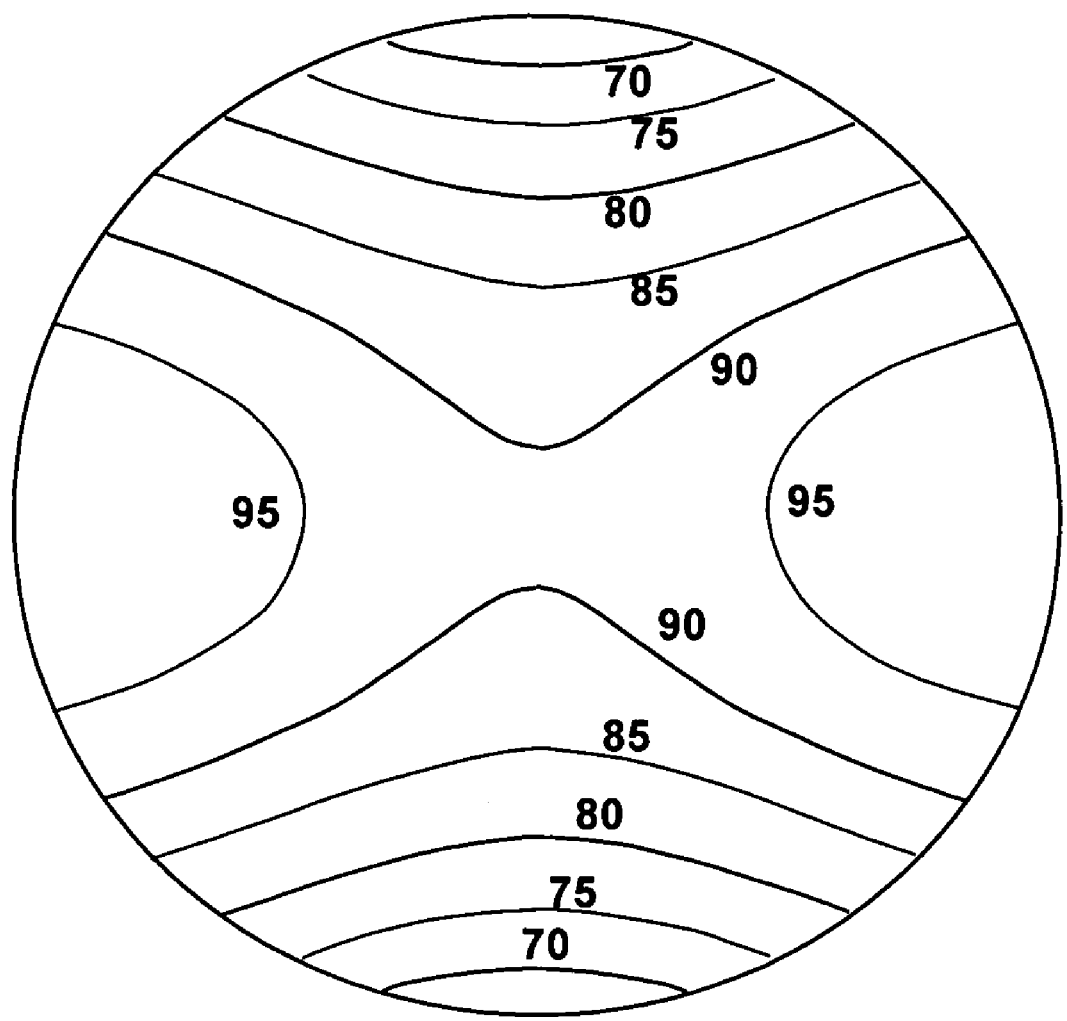
FIG. 4 is an illustration showing the correlation between the position of a light ray in the lens pupil and the angle and plane of incidence on the substrate, according to an example.
FIGS. 5A-C are contour maps illustrating transferred lens pupil information related to transmission properties obtained for different optical lithographic processing systems, according to an example.
Figure 5B:
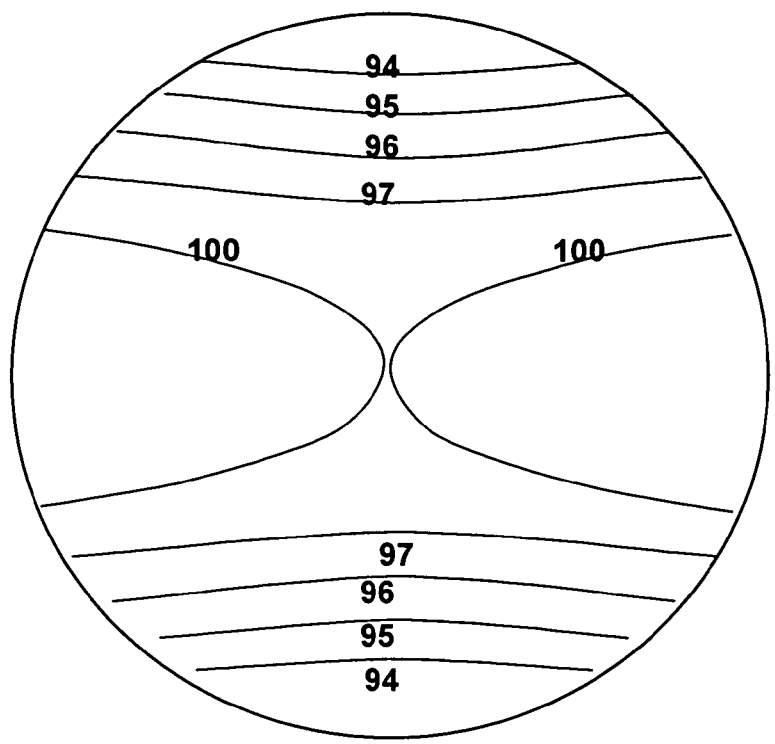
Figure 5C:
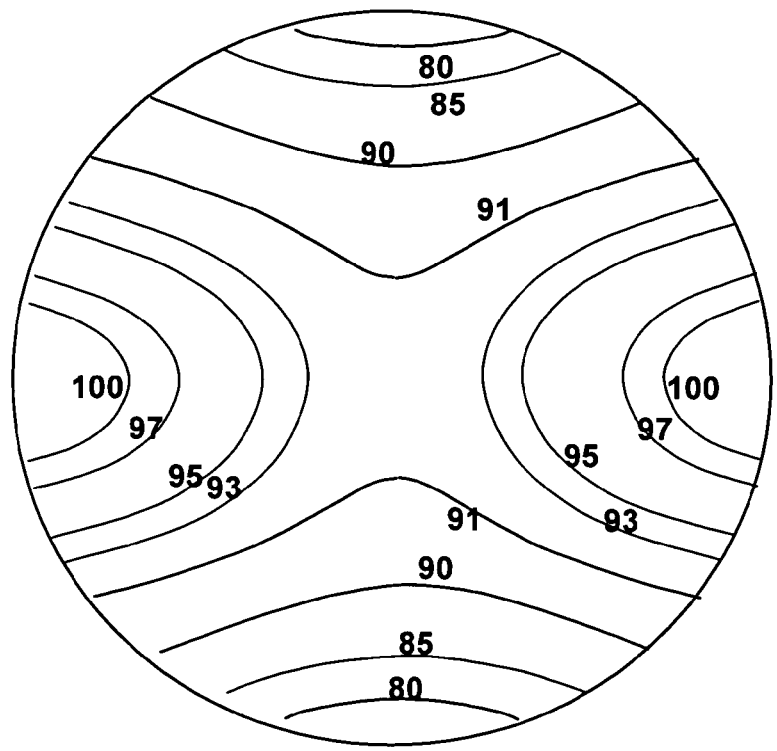

By way of example, the obtained transferred lens pupil map for the transmission efficiency for an X-polarized light source and for different lithographic set-ups is shown in FIGS. 5A-C. FIG. 5A shows a transferred lens pupil map for a 193 nm dry lithography set-up, FIG. 5B shows a transferred lens pupil map for a 193 nm wet lithography set-up and FIG. 5C shows a transferred lens pupil map for a 193 nm wet lithography set-up using a high refractive index resist. It can be seen that the numerical aperture in case of wet lithography may be significantly larger. The 193 nm wet lithographic set-up shows the best transmission properties, as there is a better refractive index match between the immersion fluid 118 (in the present example water), and the refractive index of the resist layer 112. The set-up shows a relatively homogeneous transmission between 95% and 100% over the complete transferred lens pupil map. Independent of the mask 106 used (i.e., independent of where the light in the lens pupil comes from), the transmission at the device level will be roughly the same, resulting in a good quality of the print to be made. The degree of coherence of the light source 102 will play a role once the mask diffraction related information is combined with the transferred lens pupil map.

Transferred lens pupil information related to interference efficiency may, by way of example, be determined based on the following relations (e.g. for incident s-polarized beams and p-polarized beams having the same amplitude A and for a symmetrical incidence)

$$I_p = 4A^2 \cos^2(\pi x/P) - 4A^2 \sin^2\theta \cos(2\pi x/P)$$

$$I_s = 4A^2 \cos^2(\pi x/P)$$

Figure 6:
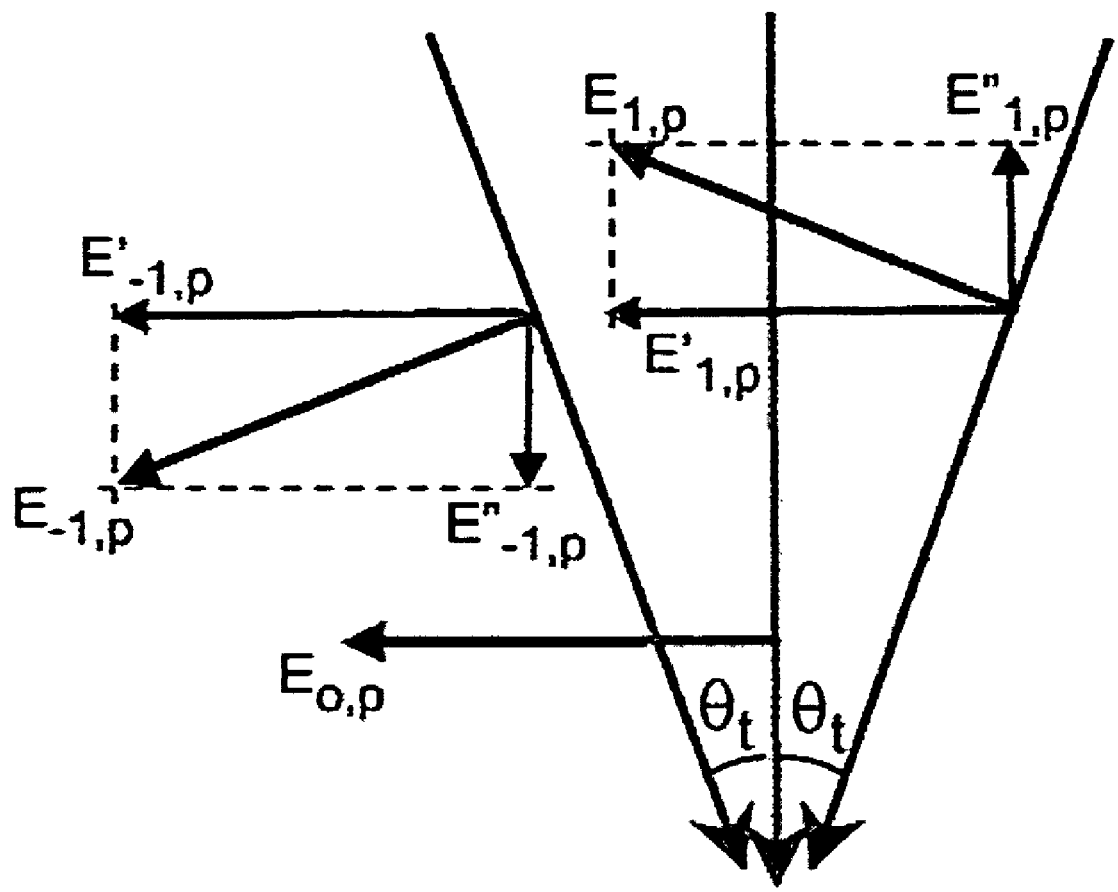
FIG. 6 is an illustration showing a model for light propagation in an optical lithographic processing system as can be used for an example method of providing interference efficiency/inefficiency values.

$I_s$ being the intensity for interfering s-polarized beams, $I_p$ being the intensity for interfering p-polarized beams, x being the position on the substrate 114 or more particularly on the resist layer 112, P being the pitch size defined by $\lambda/(2n \sin\theta)$ with $\lambda$ the wavelength of the incident beams and $\theta$ being the angle of incidence being the angle between the incident beam and the normal. Typically, for s-polarized light incident on the substrate 114, a good interference will occur between different orders of the diffracted light, as the direction of the s-component is the same. For p-polarized light, the components of the different orders of the diffracted light $E_{0,p}$, $E_{-1,p}$, $E_{+1,p}$ do not have the same direction, which is shown as an example in FIG. 6. The components perpendicular to the direction of the substrate $E''_{-1,p}$, $E''_{+1,p}$ furthermore do not cancel out each other such that there is a reduced efficiency of interference for p-polarized light, also expressed by the above stated Fresnel relations. The components $E'_{-1,p}$, $E'_{+1,p}$ parallel to the substrate are furthermore indicated in FIG. 6. FIG. 6 generally illustrates the theoretical situation for perfect coherent light.

In case of partial coherent light, the diffraction order contains many light rays all with different angles of incidence. The degree of coherence of the light source 102, which in principle will play a role once the mask diffraction related information is combined with the transferred lens pupil map, may not be taken into account for the ease of evaluation and only predetermined points. The centers of the diffraction orders, corresponding with the theoretical situation for perfect coherent light, will be used as first order approximation, which will allow evaluation. However, it should be understood that evaluation may be done at a large number of predetermined points, such as over a complete mesh. Typical examples of interference inefficiency related transferred lens pupil information maps are shown in FIGS. 2E-H.

For evaluating the reflection between the resist layer 112 and the substrate 114, a bottom anti-reflection coating (BARC), often used in lithography, may be taken into account. The thickness, the real refractive index, the absorption coefficient and the transmissivity of the bottom anti-reflection coating thus also may be parameters in the optical lithographic processing optimization. Typically for high numerical aperture techniques, the optical path length, which is dependent on the angle of incidence, may be substantially thicker than the BARC thickness. For determining the optimum BARC thickness, the various pitches, the polarization state and the imaging technique typically may need to be taken into account. In a similar way, a top anti-reflection coating (TARC) may be applied, and the thickness, the real refractive index, the absorption coefficient and the transmissivity of the top anti-reflection coating (TARC) may be parameters in the optical lithographic processing optimization.

In order to reduce the number of different transferred lens pupil maps to be constructed for different optical lithographic systems, some different techniques may be used. For example, instead of constructing transferred lens pupil maps for each lens pupil-filling factor or coherency σ of a given optical system, one may draw such a map for the maximum NA and incorporate the lens pupil filling factor or coherency σ information for a different lens pupil filling factor or coherency σ into the same map.

In a second embodiment, the present invention relates to methods for optimizing the lithographic processing of a substrate 114 by selecting and/or optimizing selectable optical lithographic system parameters for obtaining a specific image or print in a resist layer 112 on a substrate 114. An optical lithographic system typically may be considered to be defined by a set of optical lithographic system parameters such as the choice of the light source 102, characterized by amongst others its polarization state in different parts of the light source, its shape and its emission intensity or the emission intensity distribution thereof and its emission wavelength or emission wavelength range. Other parameters include the resulting lens pupil filling or coherency σ, the choice of the imaging module 108 (characterized by amongst others its numerical aperture (NA) and transparency for the chosen wavelength or wavelength range), the choice of the resist layer 112 (characterized by amongst others the real refractive index $n_{resist}$ and/or absorption coefficient and/or the transmissivity), and, if present, the choice of immersion medium 118 between the imaging module 108 and the resist layer 112 on the substrate 114 (also characterized amongst others by its real refractive index $n_{immers}$ and/or absorption coefficient and/or its transmissivity).

Figure 7:
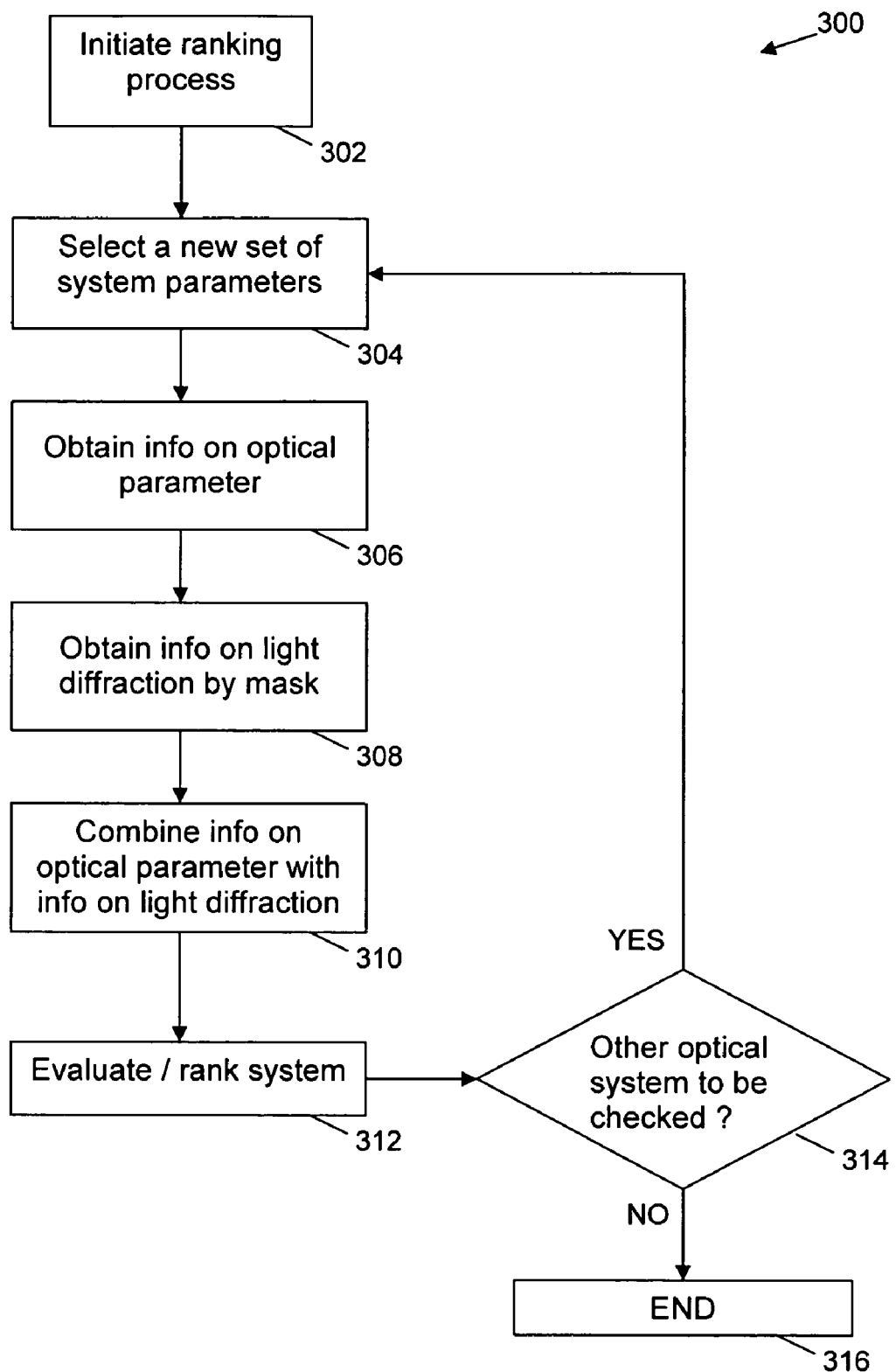
FIG. 7 is a flow diagram of a method for optimizing an optical lithographic process, according to an example.

The method for optimizing the optical lithographic processing of a substrate 114 typically comprises different steps. An exemplary overview of the method 300 is illustrated in the flow chart of FIG. 7. The method 300 may be used for performing an optimization study, wherein subsequent runs for different sets of the selectable optical lithographic system parameters may be performed and where the method allows the different sets of selectable optical lithographic system parameters to be ranked as a function of their ability to provide a sufficiently good print of the mask 106 onto a resist layer 112. Typical criteria that can be used are: obtaining an interference efficiency that is as high as possible and a transmission and reflection behaviour that has an unbalance that is as low as possible. Depending on the light intensity distribution, reflection at the top of the device may be chosen as low as possible in order to optimize the amount of light captured in the resist. The obtained NILS and/or the obtained critical dimension also may be used as a parameter for evaluating the optical system. In the case of performing an optimization study, the method 300 initiates the ranking process in step 302. Alternatively, the method may be used for checking a single optical lithographic set-up (i.e. a single set of optical lithographic system parameters), in which case no ranking process will be initiated. At step 304, a set of system parameters is selected. As described above, these system parameters may be, for example, the choice of light source 102, via the polarization state of the light at different parts of the light source 102, the polarization state of light at each point of the light source 102, the average emission intensity and/or the emission intensity distribution of the light source 102, the emission wavelength(s) of the light source 102 and/or the shape of the light source 102. Other parameters, for example, may comprise the lens pupil filling or coherency σ, the imaging module 108 (i.e., the numerical aperture or transparency thereof), the resist layer 112 (more particularly the real refractive index $n_{resist}$, absorption coefficient and the transmissivity thereof), and, if present, the choice of immersion fluid 118 (more particularly its real refractive index, absorption coefficient and its transmissivity, influencing the numerical aperture of the system, the substrate type, the mask type, a real refractive index and/or absorption coefficient and/or thickness of an anti-reflective coating, e.g. a bottom anti-reflective coating or a top anti-reflective coating).

If the method is used for checking a single optical lithographic set-up, the system parameters may be previously defined by the single optical lithographic set-up under study. In other words, by selecting the light source 102, the imaging module 108, the resist layer 112 and the immersion liquid 118 to be used, the optical lithographic system is defined. As a number of different light sources, imaging modules, resist layers and/or immersion liquids may be selectable, and optimization of a system may be carried out. In step 306, info on an optical parameter on the substrate level is obtained under the form of transferred lens pupil information. The different optical parameters that may be used in the embodiments of the present invention are the transmission of light into the resist, the reflection at the interface resist layer 112/substrate 114 or at other interfaces between layers at the device level and the interference efficiency or interference inefficiency in the resist layer 112. The obtained transferred lens pupil information may be related to at least one optical parameter (i.e., to one optical parameter or a plurality of optical parameters). Using more optical parameters allows obtaining an improved view on the compatibility of the optical lithographic system with the mask to be used. The information may, for example, be obtained directly by determination of the transferred lens pupil information by using the method as described in the first embodiment or by measurement of a corresponding parameter for the lithographic system defined according to the set of system parameters selected at step 304, or the information may be obtained by using predetermined transferred lens pupil information (i.e., information provided by the manufacturer of an optical lithographic system or information previously stored and/or information available from literature). Transferred lens pupil information may be calculated in advance for a number of combinations of system parameters and provided by manufacturers of an optical lithographic system or determined during set-up or calibration of a system.

At step 308, info on the light in the lens pupil diffracted by the mask 106 (i.e., diffraction related information), is obtained. In the step 106, information on the position of the diffraction orders of the light diffracted by the mask 106 in the lens pupil is obtained. For example, it is indicated where light coming from the mask 106 will be present on the lens pupil and hence from which point(s) this light will be propagated towards the resist layer 112. The position of the light spots in the lens pupil will not only be determined by the pattern of the mask 106, but also by the type of mask. For example, with a binary mask typically a zero diffraction order in the center and two first orders at opposite positions are present, whereas in case of an alternating phase shift mask, only the two first orders at opposite positions will be present. It is to be noted that the mask 106 to be used may be part of a set of lithographic masks. The optimization, or checking, then may be performed for the mask 106 under study, or a lithographic system suitable for use with the complete set of lithographic masks may be performed. In case of complicated masks, it may be decided to split up the mask to be used into different masks, e.g. grouping the features of same size or the features having substantially a same orientation, allowing to perform a better optimization for the different submasks and, in the end, allowing to obtain a better image quality of the printed image in the resist. However, it should be noted that the use of different masks typically results in a high overall mask cost and that alignment problems need to be taken into account. For example, the mask typically could be split into X- and Y-directed gratings, where for each submask, the optimal conditions could be determined and the image in the resist layer 112 is obtained using a two mask exposure process. It should be noted that that different parameters may need to be adjusted during lithographic processing of the substrate 114. For the ease of description, the present method is described for a single mask 106 to be used, although multiple masks are possible.

At step 310, the information related to the diffraction by the mask 106 (i.e., the diffraction related information and the transferred lens pupil information defined by the system parameters) are combined. Combining the information related to the diffraction by the mask and the transferred lens pupil information may comprise combining the information concerning the position of the diffraction orders in the lens pupil and the transferred lens pupil information and extracting relevant information for the corresponding optical parameters. When transferred lens pupil maps are available, the diffraction related information may be indicated on the transferred lens pupil maps. Depending on the optical parameter studied, the relevant information may be the center(s) of the diffraction order, for example as a first order approximation in case of interference efficiency/inefficiency with partial coherent light, or the complete spot(s) of the diffraction order (e.g., in order to study transmission or reflection properties).

At step 312, the obtained combined information is evaluated and may be carried out in reference to predetermined values for the optical parameter or optical parameters or relative to results already obtained for other sets of system parameters in combination with the mask 106. In this way a ranking can be obtained/performed. Typically, the obtained results may be stored in a memory and/or outputted. The stored or outputted information typically comprises the system parameters that define the optical lithographic system, and evaluation or ranking information. Step 312 may be performed by a user or in a more automated way. Such automation may be based on specific computer implemented algorithms, neural networks, etc. If the method is used for evaluation of only checking a single optical lithographic set-up, evaluation may be carried out relative to predetermined values. Criteria for evaluating an optical lithographic system with a selected set of parameters may comprise obtaining a high interference efficiency, optimizing the transmission and reflection properties (e.g., by optimizing the transmission efficiency and reducing the reflected intensity at the top surface of the device, by optimizing transmission and reflection properties at interfaces between different layers of the device or by optimizing the obtained NILS and/or the obtained critical dimension of the features obtained) At the step 312, information is obtained concerning the suitability of an optical lithographic system, defined by lithographic system parameters, for the lithographic processing to be performed with a specific mask.

In a further step 314, it is verified whether another optical system, (i.e., an optical lithographic system defined by another set of system parameters) needs to be evaluated. If no further system parameters need to be evaluated, the method ends at step 316. If other system parameters should be checked, the method returns to step 304, where a different set of system parameters is selected. By using the above method, an optimization process of the system parameters (e.g., the lens pupil-filling or coherency factor σ, the source polarization, etc.) allows to obtain the best possible image print in the resist 112 for the available lithographic set-ups. Besides selecting the most appropriate set-up for performing the lithographic processing, i.e. comprising selecting the resist 112 (e.g., based on real refractive index and/or absorption coefficient and/or a thickness), selecting an immersion liquid (e.g., based on real refractive index and/or absorption coefficient), selecting the mask type (e.g. being a binary mask (BIM), an alternating phase shift mask (alt.-PSM), an attenuated phase shift mask (att. PSM), etc.), selecting the use of OPC features, selecting whether a single or double exposure is used, and/or selecting the polarization state of different parts of the light source 102 (e.g., the polarization state of light at each point of the light source 102, NA and the lens pupil-filling factor or coherency σ, incorporating the source shape and the intensity profile of the source). Also, additional changes to a lithographic processing system may be provided, such as, for example, adding additional compensating masks/layers to correct or compensate for optical parameter differences, such as the use of anti-reflective coatings (e.g., bottom anti-reflective coating (BARC) or a top anti-reflective coating (TARC)), the use of trimming, etc.

Figure 8A:
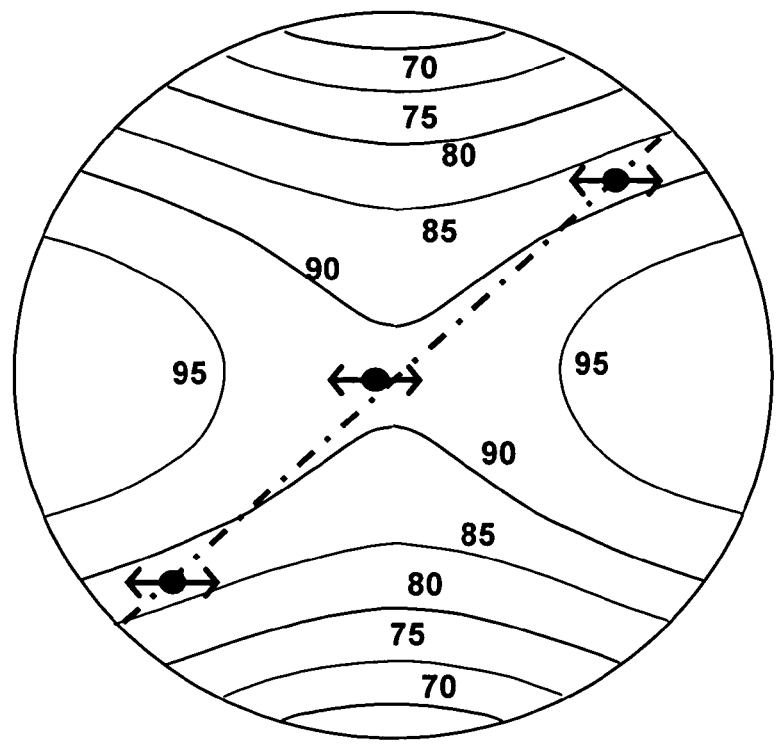
FIGS. 8A-D illustrate combined transferred lens pupil maps and diffraction related information for different lithographic set-ups, according to an example.
Figure 8B:
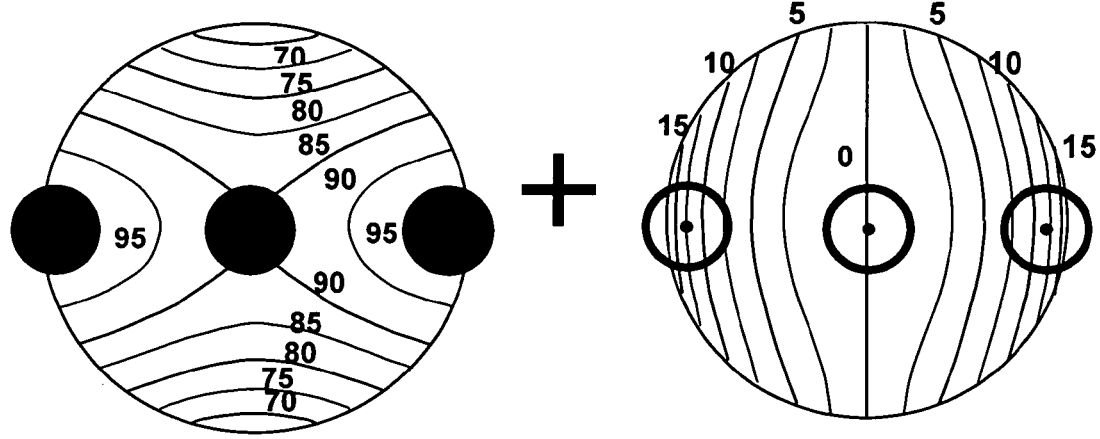
Figure 8C:
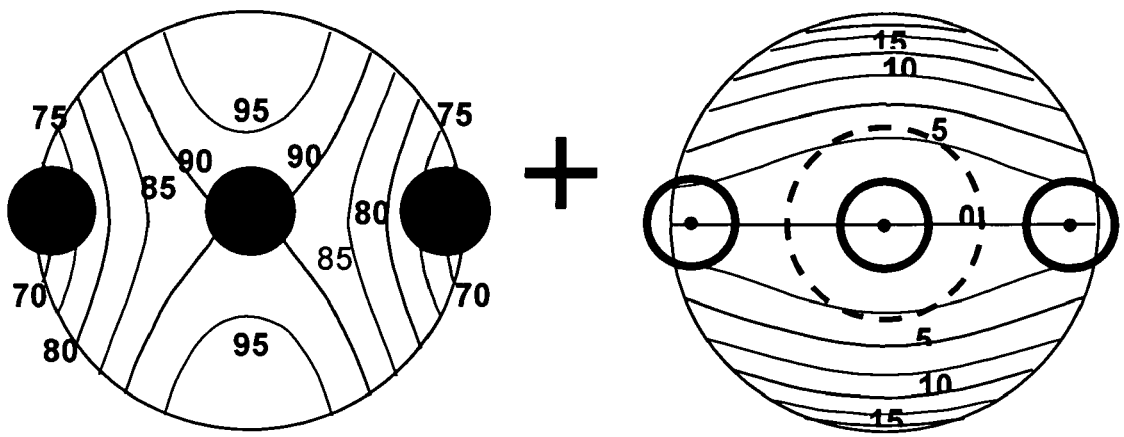
Figure 8D:
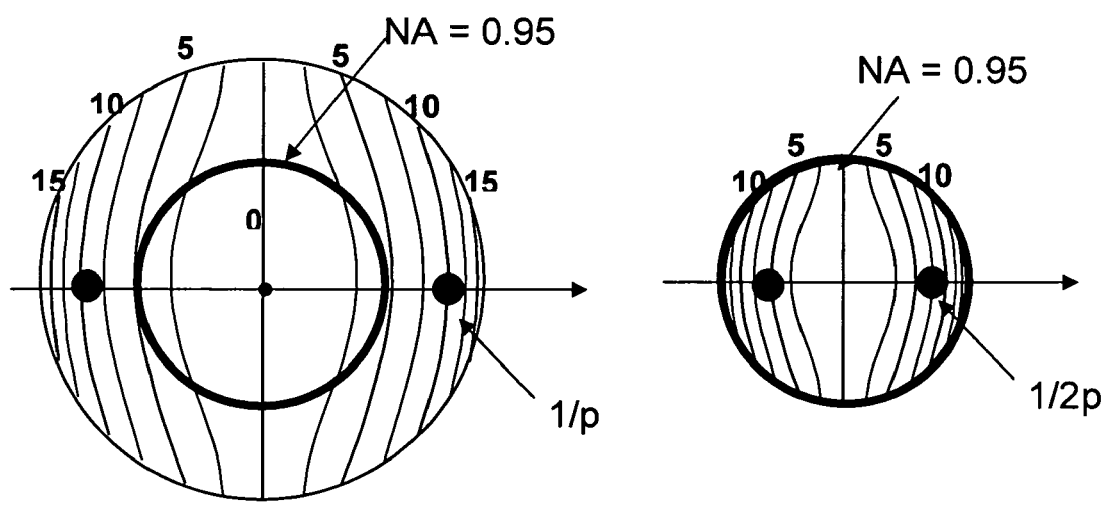

By way of illustration, combined transferred lens pupil information and diffraction information is shown for a number of examples in FIGS. 8A-D. FIG. 8A illustrates the transferred lens pupil map with respect to transmission properties, for example, transmission efficiency, for an X-polarized light source, a moderate pitch, a coherent light source and a grating under 45° direction. It can be seen that the difference in transmission properties between the zero diffraction order and the first diffraction orders is small. For example, there is almost no amplitude unbalance between the diffraction orders, which results in almost no loss of image contrast. In FIGS. 8B-C, the transmission properties, shown as transmission efficiency (left map) and the interference inefficiency (right map) are illustrated for an X-polarized light source respectively for an Y-polarized light source. In FIG. 8D, the interference inefficiency is illustrated for diffraction orders of different types of masks. On the left map, the results for a binary mask, which result in a central and two first diffraction orders, are shown, whereas on the right map the results for an alternating phase shift mask, resulting in two first diffraction orders, are shown. For the same pitch and the same numerical aperture, different positions of the first diffraction orders are obtained. In other words, for a binary mask, interaction between the zero and first order diffraction beams need to be taken into account, whereas for an alternating phase shift mask, interaction between the two first order diffraction beams need to be taken into account.

Some exemplary methods will be further discussed now.

Figure 9:
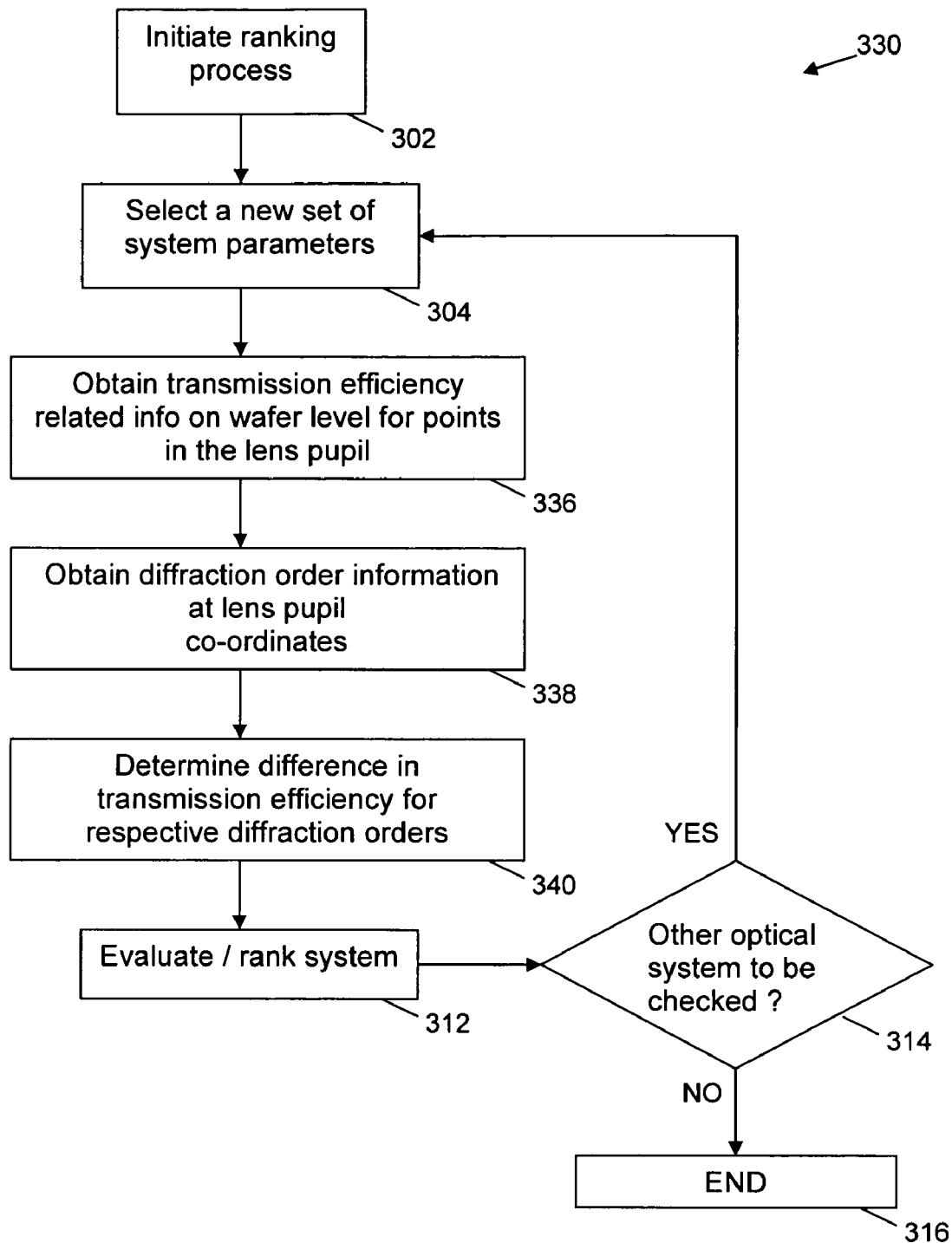
FIG. 9 is a flow diagram of an example method for optimizing the transmission characteristics at the device level in an optical lithographic process.

A first example of a method for optimizing the lithographic processing of the substrate 114 is a method whereby information is obtained about the transmission properties (i.e., the transmission efficiency) of the light at the level of the resist layer 112. The method comprises the same steps as the method described above and shown in FIG. 7. A more detailed description of this exemplary method 330 is provided in the flow chart of FIG. 9, whereas steps 306, 308, 310 are replaced by steps 336, 338, 340. In the present example, obtaining information about an optical parameter comprises obtaining information about the relative or absolute transmission properties, for example transmission efficiency at the resist layer 112 level, corresponding with step 336. Obtaining information on light diffraction by the mask 106 comprises obtaining diffraction order information at lens pupil coordinates, the diffraction order information being determined by the diffraction introduced by the mask 106. The latter is performed at step 338. In step 340, the diffraction information and the transmission efficiency related info are combined with each other. Combining this information may be determining the difference in transmission properties, e.g. efficiency, for respective diffraction orders. Evaluating or ranking the system, which is done at step 312, may comprise evaluating these differences in transmission efficiency for respective diffraction orders. Typically, the smaller these differences are, the higher the quality of the lithography is. For partially coherent light, the areas determining the diffraction spots will be larger. In the evaluation of the system, besides an evaluation of the different transmission properties between the different diffraction spots, different transmission properties within diffraction spots may also be evaluated, as well as whether the diffraction spots are completely within the lens pupil.

Figure 10:
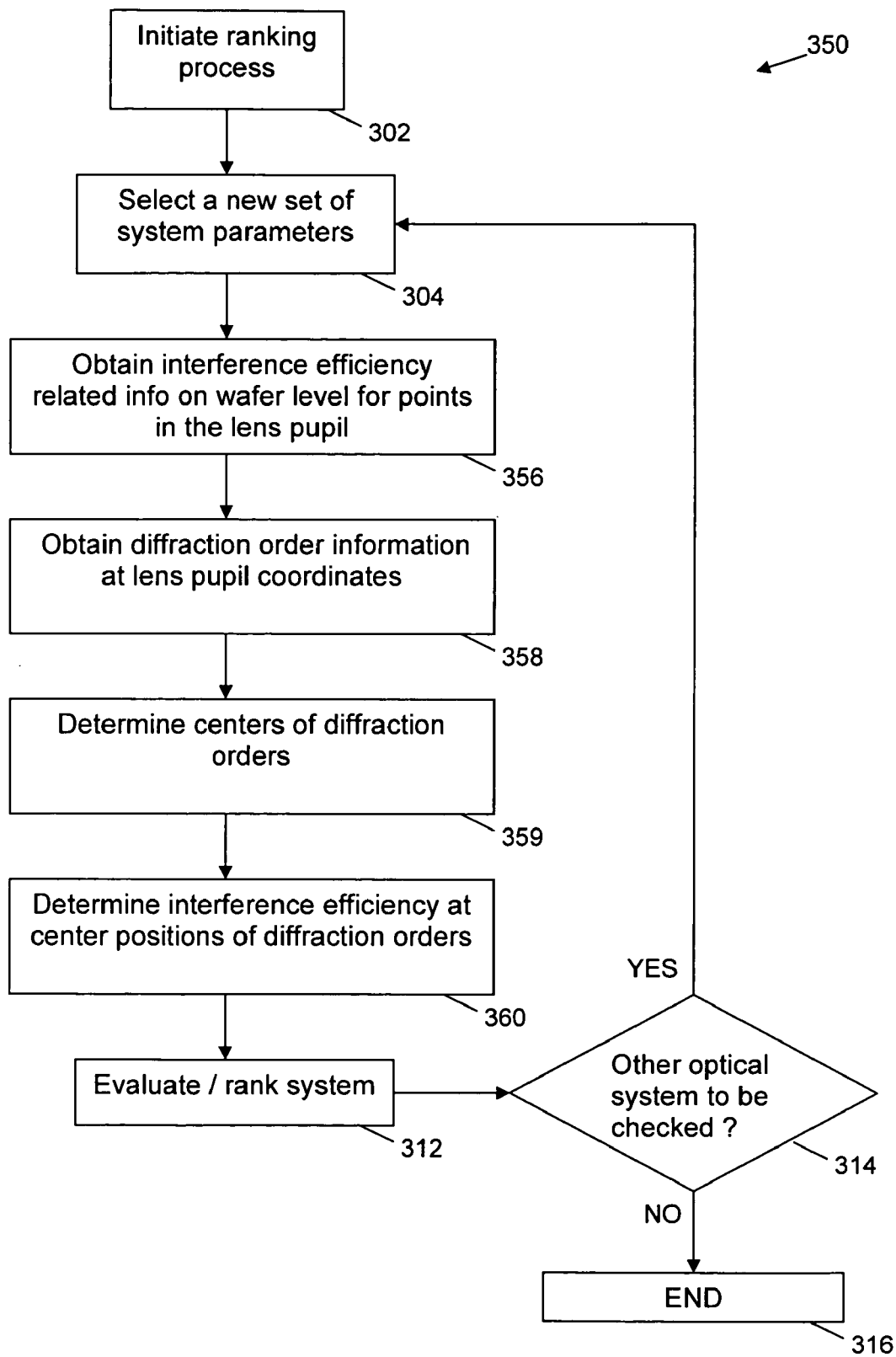
FIG. 10 is a flow diagram of an example method for optimizing the interference characteristics at the device level in an optical lithographic process.

A second example of a method for obtaining optical information for use in lithographic processing of a substrate is a method for obtaining information about the interference efficiency/inefficiency in the resist layer 112 for the lithographic processing of the substrate 114. An overview of the different steps of this exemplary method 350 is shown in FIG. 10. The method comprises the same steps as the method 300 described above and shown in FIG. 7, whereas steps 306, 308 and 310 are described in more detail by steps 356, 358, 359 and 360. In step 356, interference efficiency or inefficiency related information in the form of transferred lens pupil information is obtained. The interference effect occurs at the level of the resist layer 112. A more detailed description of obtaining transferred lens pupil information related to interference efficiency or inefficiency is described in the first embodiment. In step 358, diffraction order information at the lens pupil coordinates is obtained.

In general, for optimization of the lithographic processing based on interference efficiency/inefficiency, the diffraction related information may be restricted to position related information of predetermined points, e.g. the centers of the diffraction orders, which may be determined in step 358 or optionally may be determined from the diffraction order spots in a separate step 359. In the theoretical case of perfect coherent light, the obtained combined information, obtained in step 360, is a direct representation of the interference efficiency or interference inefficiency of the system. In the case of partial coherent light, the obtained combined information, obtained in step 360, is a good first order approximation. In both cases, this information typically allows evaluation of the optical lithographic system defined by the chosen set of lithographic system parameters. In other words, if partially coherent light is present, the theoretical situation for perfect coherent light is used to evaluate the interference efficiency or interference inefficiency. It is to be noted that a more elaborate model, using further information of the diffraction orders, may also be used. The interference efficiency or interference inefficiency corresponding to the position of predetermined points. For example the centers of the first diffraction orders may be indicative of the quality of the image formed in the resist of the given optical system for a given grating structure. A possible evaluation criterion may be the difference in interference efficiency/inefficiency between the different diffraction orders. Such a criterion may be expressed as predetermined points (e.g., the center points of the diffraction orders ideally being located on countermines with the same interference efficiency/inefficiency). Another example of a relevant criterion is that the interference inefficiency in predetermined points (e.g., the center points of the diffraction order is not larger than a predetermined value). Examples of interference inefficiency maps are shown in the bottom maps of FIGS. 3C-D.

It is an advantage of the present embodiment that the mask information may be obtained from a calculation using the mask design (i.e. based on computational efforts), thus avoiding the need for having already obtained the mask 106 prior to the optimization procedure.

Figure 11:
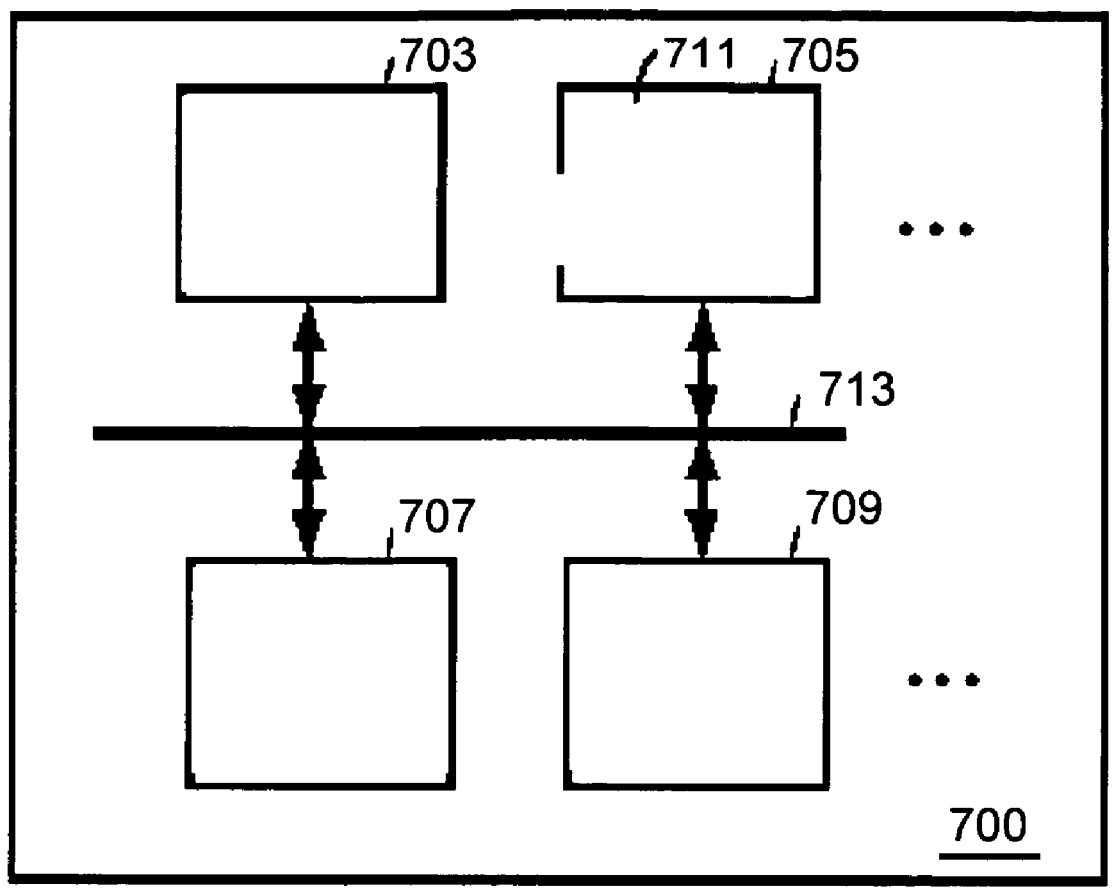
FIG. 11 is an illustration of a computer system that may be used to perform the example methods of optical lithographic processing or for constructing transferred lens pupil information, according to an example.

The above-described method embodiments of the present invention may be implemented in a processing system 700 such as shown in FIG. 11. FIG. 11 shows one configuration of processing system 700 that includes at least one programmable processor 703 coupled to a memory subsystem 705 that includes at least one form of memory (e.g., RAM, ROM, and so forth). A storage subsystem 707 may be included that has at least one disk drive and/or CD-ROM drive and/or DVD drive. In some implementations, a display system, a keyboard, and a pointing device may be included as part of a user interface subsystem 709 to provide a user manual input information. Ports for inputting and outputting data may also be included. More elements such as network connections, interfaces to various devices, and so forth, may be included, but are not illustrated in FIG. 11. The various elements of the processing system 700 may be coupled in various ways, including a bus subsystem 713 shown in FIG. 11 as a single bus (for simplicity). The memory of the memory subsystem 705 may at some time hold part or all of a set of instructions that when executed on the processing system 700, implement the steps of the methods described herein.

It is to be noted that the processor 703 or processors may be a general purpose, or a special purpose processor, and may be included in a device (e.g., a chip that has other components that perform other functions). Thus, one or more aspects of the present invention can be implemented in digital electronic circuitry, or in computer hardware, firmware, software, or in combinations of them. Furthermore, aspects of the invention can be implemented in a computer program product tangibly embodied in a carrier medium carrying machine-readable code for execution by a programmable processor. The term "carrier medium" refers to any medium that participates in providing instructions to a processor for execution. Such a medium may take many forms, including but not limited to, non-volatile media, and transmission media. Non volatile media includes, for example, optical or magnetic disks, such as a storage device which is part of mass storage. Volatile media includes mass storage. Volatile media includes dynamic memory such as RAM. Common forms of computer readable media include, for example, a floppy disk, a flexible disk, a hard disk, magnetic tape, or any other magnetic medium, a CD-ROM, any other optical medium, punch cards, paper tapes, any other physical medium with patterns of holes, a RAM, a PROM, an EPROM, a FLASH-EPROM, any other memory chip or cartridge, a carrier wave as described hereafter, or any other medium from which a computer can read. Various forms of computer readable media may be involved in carrying one or more sequences of one or more instructions to a processor for execution.

The instructions, for example, may initially be carried on a magnetic disk of a remote computer. The remote computer can load the instructions into its dynamic memory and send the instructions over a telephone line using a modem. A modem local to the computer system can receive the data on the telephone line and use an infrared transmitter to convert the data to an infrared signal. An infrared detector coupled to a bus can receive the data carried in the infrared signal and place the data on the bus. The bus carries data to main memory, from which a processor retrieves and executes the instructions. The instructions received by main memory may optionally be stored on a storage device either before or after execution by a processor. The instructions can also be transmitted via a carrier wave in a network, such as a LAN, a WAN or the Internet. Transmission media can take the form of acoustic or light waves, such as those generated during radio wave and infrared data communications. Transmission media include coaxial cables, copper wire and fibre optics, including the wires that comprise a bus within a computer.

It is to be understood that although preferred embodiments, specific constructions and configurations, as well as materials, have been discussed herein for devices according to the present invention, various changes or modifications in form and detail may be made without departing from the scope and spirit of this invention.

I claim:

1. A method for setting up lithographic processing of a device, the method comprising:

selecting a set of system parameters for an optical lithographic system having selectable system parameters;

for each point of a set of points within a lens pupil of the optical lithographic system associated with the selected set of system parameters, obtaining a value of at least one optical parameter at a level of the device, wherein the at least one optical parameter comprises a property of a light ray projected towards the device from a point selected from the set of points and wherein the value of the at least one optical parameter is obtained by determining a polarization state of a light ray incident on the device;

combining data comprising the obtained values linked with positions of the set of points with data comprising at least one mask used for optical lithographic processing of the device, thereby generating combined data; and evaluating, based on the combined data, a combination of the selected set of system parameters and the at least one mask.

2. The method of claim 1, wherein the combined data comprises determining locations in the lens pupil corresponding with diffraction orders being at least partly present in the lens pupil.

3. The method of claim 2, wherein the at least one optical parameter comprises transmissivity, wherein light in the optical lithographic system is diffracted by the at least one mask, and wherein the combining data further comprises:

obtaining predetermined points in the locations in the lens pupil the values of the transmissivity associated with the predetermined points.

4. The method of claim 3, wherein the predetermined points in the locations are sampled substantially over a complete area of the locations in the lens pupil.

5. The method of claim 2, wherein the at least one optical parameter comprises interference, wherein light in the optical lithographic system is diffracted by the at least one mask and wherein the combining data further comprises:

obtaining predetermined points in the locations in the lens pupil the values of the transmissivity associated with the predetermined points.

6. The method of claim 5, wherein the predetermined points in the locations comprise centers of the locations.

7. The method of claim 1, wherein evaluating further comprises ranking the combination of the selected set of system parameters and the at least one mask.

8. The method of claim 1, wherein the data comprising the obtained values linked with positions of the set of points includes data associated with a polarization of a light source.

9. The method of claim 1, wherein the optical lithographic system comprises a light source, an imaging module, a resist layer on a substrate and an immersion fluid, and wherein the selectable system parameters are selected from the group consisting of numerical aperture, real refractive index of the resist layer, absorption coefficient of the resist layer, transmissivity of the resist layer, real refractive index of the immersion fluid, absorption coefficient of the immersion fluid, transmissivity of the immersion fluid, polarization state of the light at different parts of the light source, emission intensity of the light at the light source, emission wavelength of the light of the light source, emission wavelength range of the light of the light source, shape of the light source, real refractive index of a bottom anti-reflective coating, absorption coefficient of the bottom anti-reflective coating, thickness of the bottom anti-reflective coating, substrate type, mask type, real refractive index of a top anti-reflective coating, absorption coefficient of the top anti-reflective coating, and thickness of the top anti-reflective coating.

10. The method of claim 1, wherein the data comprising the obtained values linked with positions of the set of points is indicated in a 2-dimensional intensity plot.

11. The method of claim 1, wherein obtaining the value of the least one optical parameter at the level of the device is based on calculation using Fresnel relations.

12. The method of claim 1, further comprising:
using the evaluation based on the combined data of the combined information to provide input to a lithography simulator that uses full-system calculations.

13. A method for obtaining lithographic processing related information for lithographic processing of a device, the method comprising, selecting a set of system parameters for an optical lithographic system having selectable system parameters;

for each point of a set of points within a lens pupil of the optical lithographic system associated with the selected set of system parameters, obtaining a value of at least one optical parameter at a level of the device, wherein the at least one optical parameter comprises a property of a light ray projected towards the device from a point selected from the set of points and wherein the value of the at least one optical parameter is obtained by determining a polarization state of a light ray incident on the device; and performing at least one of storing and outputting for each point of the set of points within the lens pupil, the value of the at least one optical parameter combined with coordinates for the point selected from the set of points.

14. The method of claim 13, wherein the optical lithographic system comprises a light source, an imaging module, a resist layer on a substrate and an immersion fluid, and wherein the selectable system parameters are selected from the group consisting of numerical aperture, real refractive index of the resist layer, absorption coefficient of the resist layer, transmissivity of the resist layer, real refractive index of the immersion fluid, absorption coefficient of the immersion fluid, transmissivity of the immersion fluid, polarization state of the light at different parts of the light source, emission intensity of the light at the light source, emission wavelength of the light of the light source, emission wavelength range of the light of the light source, shape of the light source, real refractive index of a bottom anti-reflective coating, absorption coefficient of the bottom anti-reflective coating, thickness of the bottom anti-reflective coating, substrate type, mask type, real refractive index of a top anti-reflective coating, absorption coefficient of the top anti-reflective coating, and thickness of the top anti-reflective coating.

15. The method of claim 13, wherein obtaining the value of at least one optical parameter at the level of the device is based on calculation using Fresnel relations.

16. The method of claim 13, wherein performing at least one of storing and outputting is carried out using a 2-dimensional intensity plot.

17. A system for setting up lithographic processing of a device, the system comprising:

means for obtaining a set of system parameters characteristic of an optical lithographic system;

means for obtaining, for each point of a set of points within a lens pupil of the optical lithographic system, a value for at least one optical parameter at the level of the device, wherein the value is obtained by determining a polarization state of a light ray incident on the device; and means for combining the calculated values linked to the corresponding points in the lens pupil with information about at least one mask, resulting in combined information.

18. A system for obtaining lithographic processing related information for lithographic processing of a device, the system comprising:

means for obtaining a set of system parameters characteristic of an optical lithographic system;

means for obtaining, for each point of a set of points within a lens pupil of the optical lithographic system, a value for at least one optical parameter at the level of the device, wherein the value is obtained by determining a polarization state of a light ray incident on the device; and means for performing at least one of storing and outputting, for each point of the set of points within the lens pupil, the value of the at least one optical parameter combined with coordinates for the point in the lens pupil.

* * * * *